United States Patent
Oowada et al.

(10) Patent No.: US 9,123,424 B2
(45) Date of Patent: Sep. 1, 2015

(54) OPTIMIZING PASS VOLTAGE AND INITIAL PROGRAM VOLTAGE BASED ON PERFORMANCE OF NON-VOLATILE MEMORY

(71) Applicant: SanDisk Technologies Inc., Plano, TX (US)

(72) Inventors: Ken Oowada, Fujisawa (JP); Shota Murai, Fujisawa (JP)

(73) Assignee: SanDisk Technologies Inc., Plano, TX (US)

( * ) Notice: Subject to any disclaimer, the term of this patent is extended or adjusted under 35 U.S.C. 154(b) by 1 day.

(21) Appl. No.: 14/108,677

(22) Filed: Dec. 17, 2013

(65) Prior Publication Data

US 2015/0170746 A1    Jun. 18, 2015

(51) Int. Cl.
*G11C 16/04* (2006.01)
*G11C 16/10* (2006.01)

(52) U.S. Cl.
CPC ..................................... *G11C 16/10* (2013.01)

(58) Field of Classification Search
USPC ................................ 365/185.18, 185.28, 211
See application file for complete search history.

(56) References Cited

U.S. PATENT DOCUMENTS

| | | | |
|---|---|---|---|
| 6,870,766 B2 | 3/2005 | Cho et al. | |
| 7,408,810 B2 | 8/2008 | Aritome et al. | |
| 7,471,565 B2 | 12/2008 | Aritome | |
| 7,630,254 B2 | 12/2009 | Lutze | |
| 7,715,239 B2 | 5/2010 | Aritome | |
| 7,916,543 B2 | 3/2011 | Goda et al. | |
| 8,149,625 B2 | 4/2012 | Hwang | |
| 8,320,177 B2 | 11/2012 | Dutta et al. | |
| 8,422,301 B2 | 4/2013 | Shiino et al. | |
| 8,456,911 B2 | 6/2013 | Yuan et al. | |
| 2008/0266970 A1 | 10/2008 | Lee et al. | |
| 2010/0020600 A1* | 1/2010 | Lee | 365/185.03 |
| 2010/0067306 A1 | 3/2010 | Hwang | |
| 2010/0103733 A1 | 4/2010 | Hemink | |
| 2010/0124120 A1 | 5/2010 | Park et al. | |
| 2011/0199833 A1* | 8/2011 | Shim et al. | 365/185.23 |
| 2012/0300550 A1* | 11/2012 | Hemink et al. | 365/185.17 |

OTHER PUBLICATIONS

International Search Report & The Written Opinion of the International Searching Authority dated Mar. 20, 2015, International Application No. PCT/US2014/068313.

* cited by examiner

*Primary Examiner* — Hoai V Ho

(74) *Attorney, Agent, or Firm* — Vierra Magen Marcus LLP

(57) ABSTRACT

A programming techniques adaptively sets a pass voltage and an initial program voltage based on a programming speed of a set of memory cells. In one pass of a multi-pass programming operation, a programming speed-indicating program voltage is obtained. For example, this can be a final program voltage or a program voltage at another programming milestone. A pass voltage is determined for another programming pass of the multi-pass programming operation, by providing an adjustment to a reference pass voltage. An initial program voltage is determined for the another programming pass based on an offset from the programming speed-indicating program voltage. The initial program voltage is further adjusted to counteract an effect of the adjustment to a reference pass voltage. The adjustment to the initial program voltage is opposite in polarity and smaller in magnitude than the adjustment to the reference pass voltage.

20 Claims, 15 Drawing Sheets

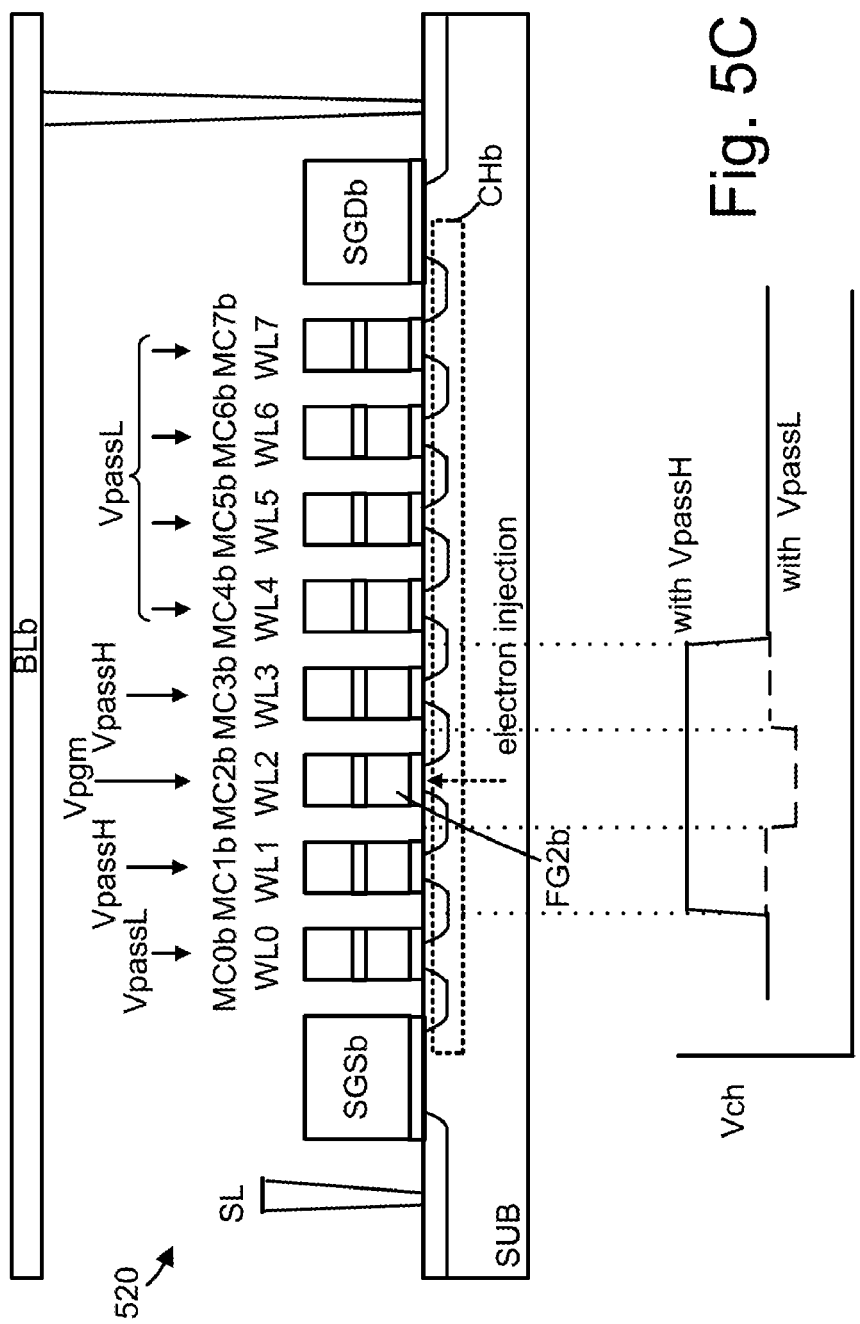

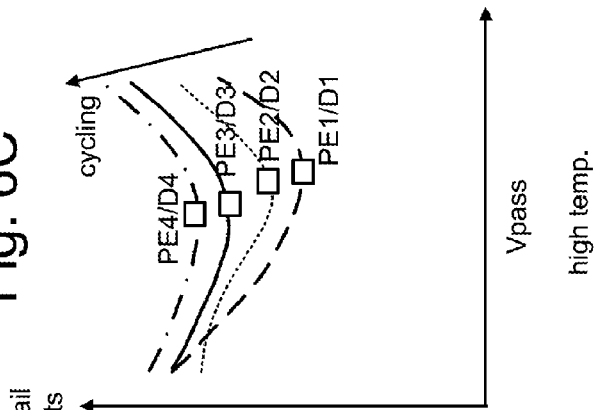
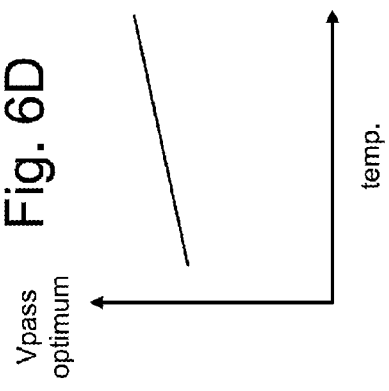
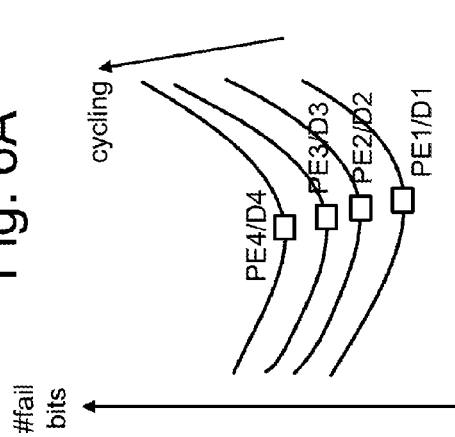

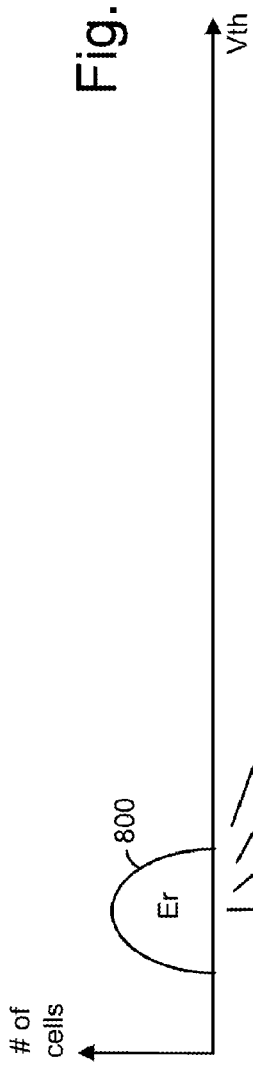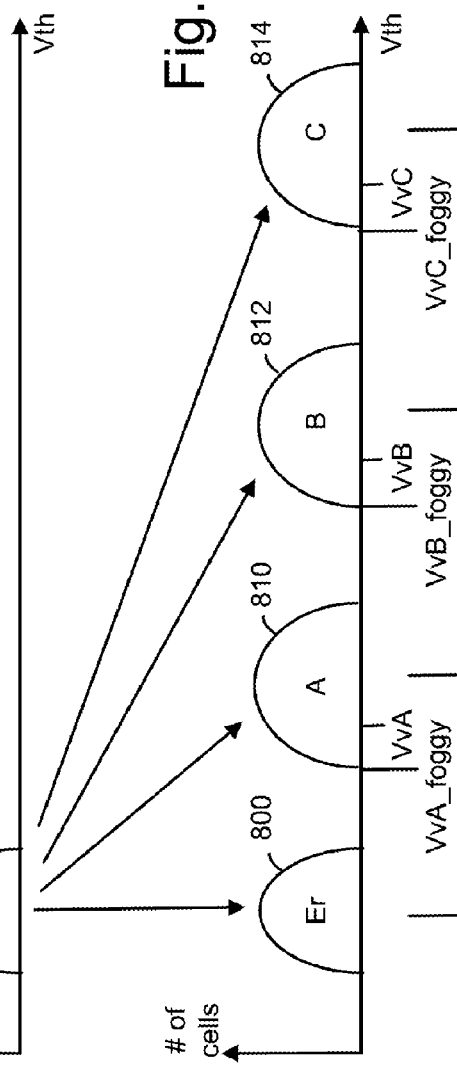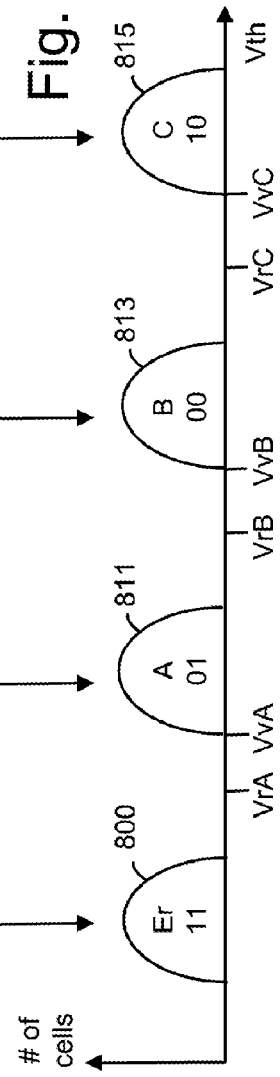

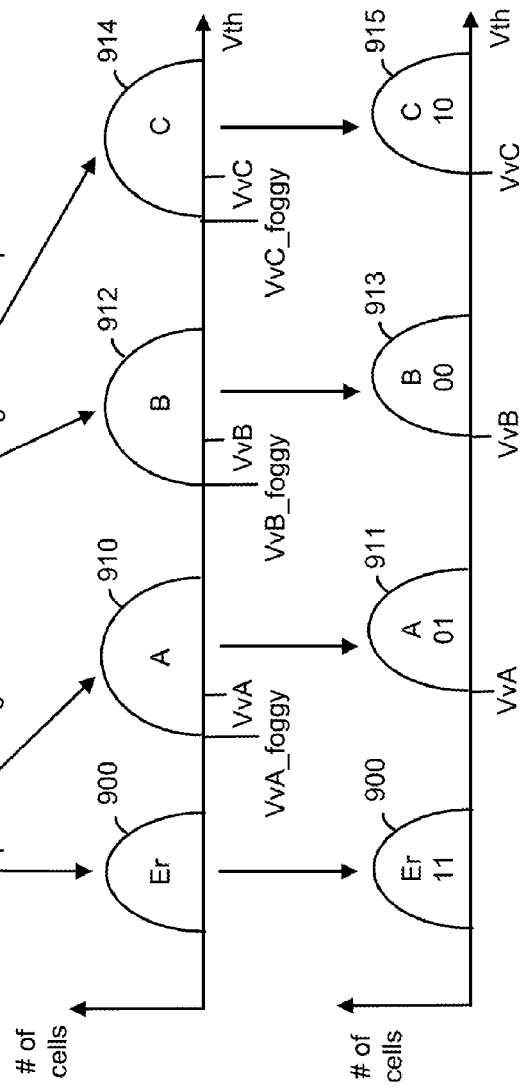

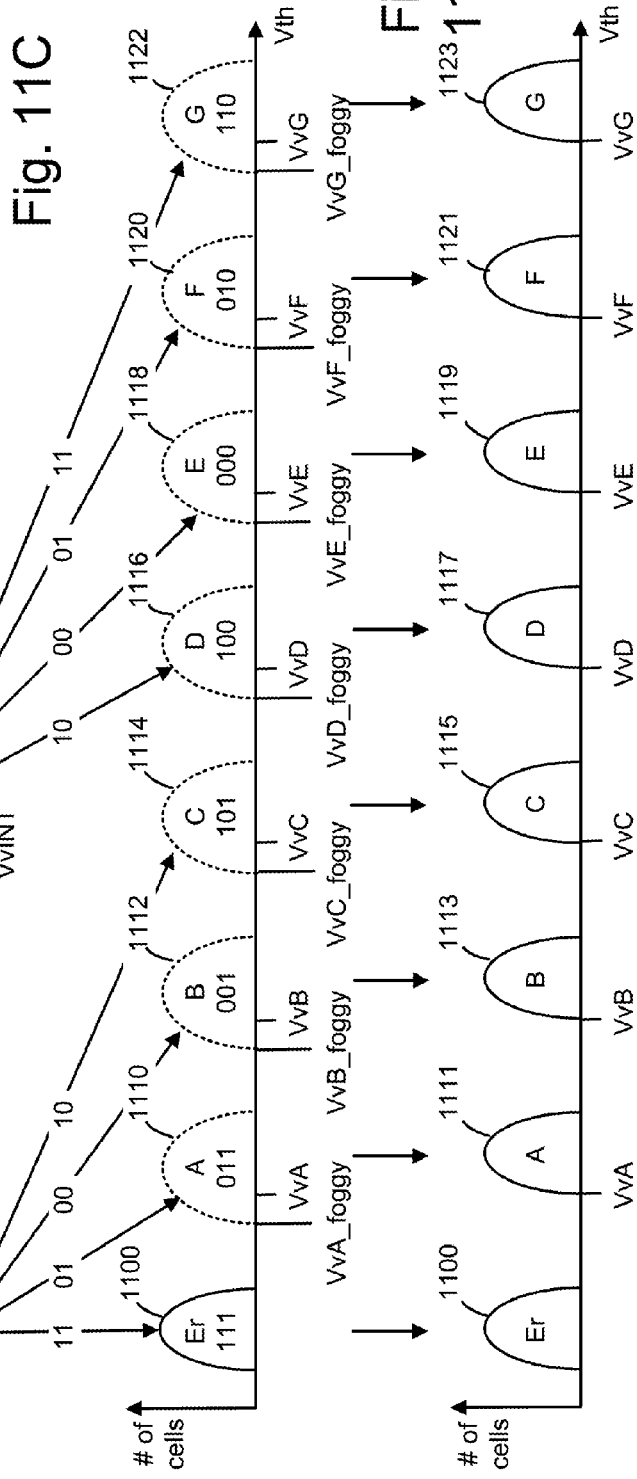

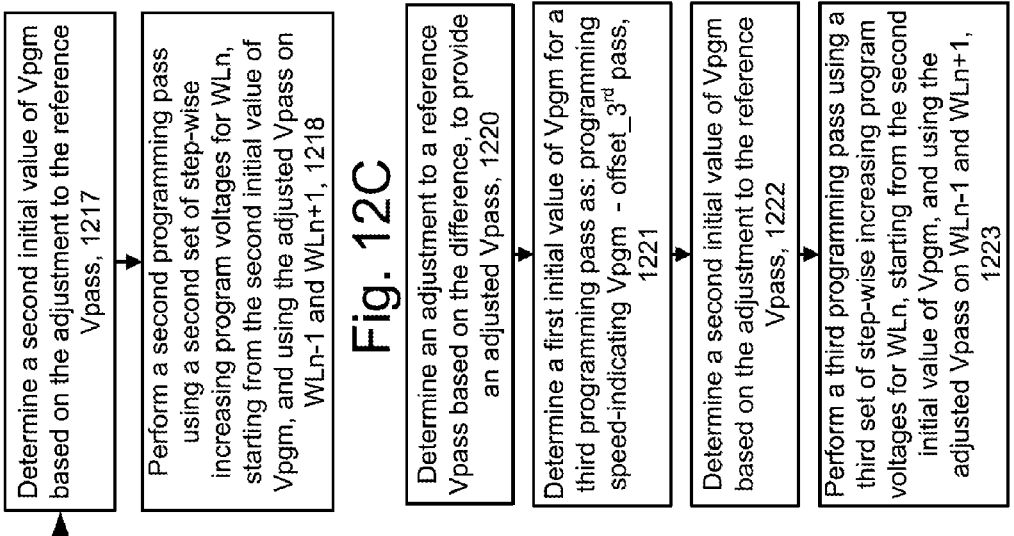
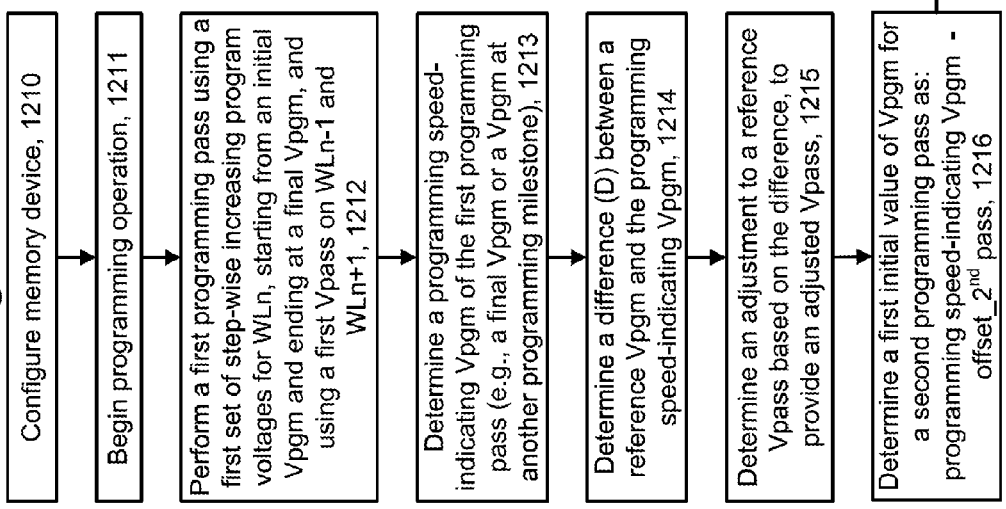

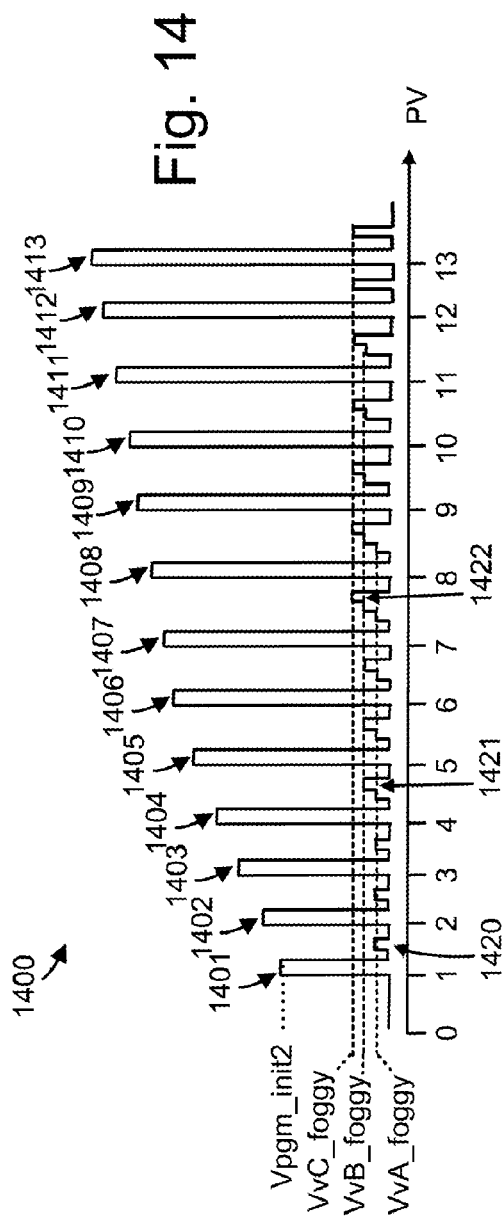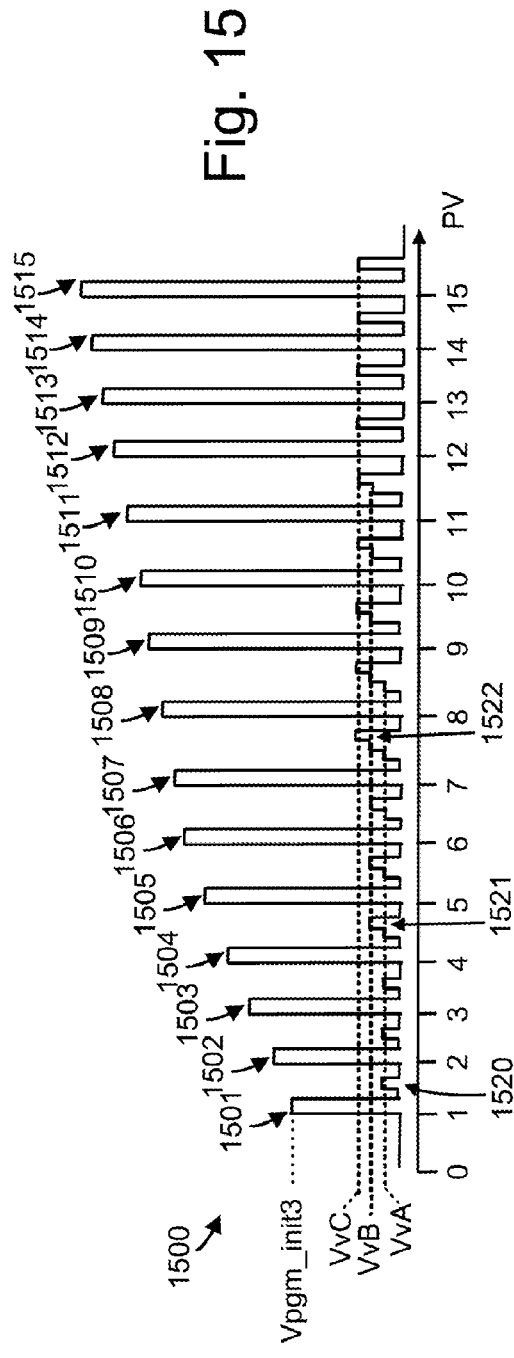

Fig. 16A fresh

|  | Vpgm initial | VpassH | Vpgm final | D=Vpgm final-Vref | Voffset |
|---|---|---|---|---|---|
| 1st pass | 10 V | 9 V | 16 V | 16-16=0 V | x |
| 2nd pass | 16-5.7=10.3 V | 9 V | x | x | 5.7 |
| 3rd pass | 16-6.2=9.8 V | 9 V | x | x | 6.2 |

Fig. 16B moderately cycled

|  | Vpgm initial | VpassH | Vpgm final | D=Vpgm final-Vref | Voffset |
|---|---|---|---|---|---|
| 1st pass | 10 V | 9 V | 15.5 V | 15.5-16=-0.5 V | x |
| 2nd pass | (15.5-5.7-0.5)=9.3 V<br>9.3+.1x25/75=9.3+.03=9.33 V | 9-Dx20%=9-.1=8.9 V | x | x | 5.7 |
| 3rd pass | (15.5-6.2-0.5)=8.8 V<br>8.8+.1x25/75=8.83 V | 8.9 V | x | x | 6.2 |

Fig. 16C heavily cycled

|  | Vpgm initial | VpassH | Vpgm final | D=Vpgm final-Vref | Voffset |
|---|---|---|---|---|---|
| 1st pass | 10 V | 9 V | 15.0 V | 15.0-16=-1.0 V | x |
| 2nd pass | (15.0-5.7-1.0)=8.3 V<br>8.3+.2x25/75=8.3+.06=8.36 V | 9-Dx20%=9-.2=8.8 V | x | x | 5.7 |
| 3rd pass | (15.0-6.2-1.0)=7.8 V<br>7.8+.2x25/75=7.8+.06=7.86 V | 8.8 V | x | x | 6.2 |

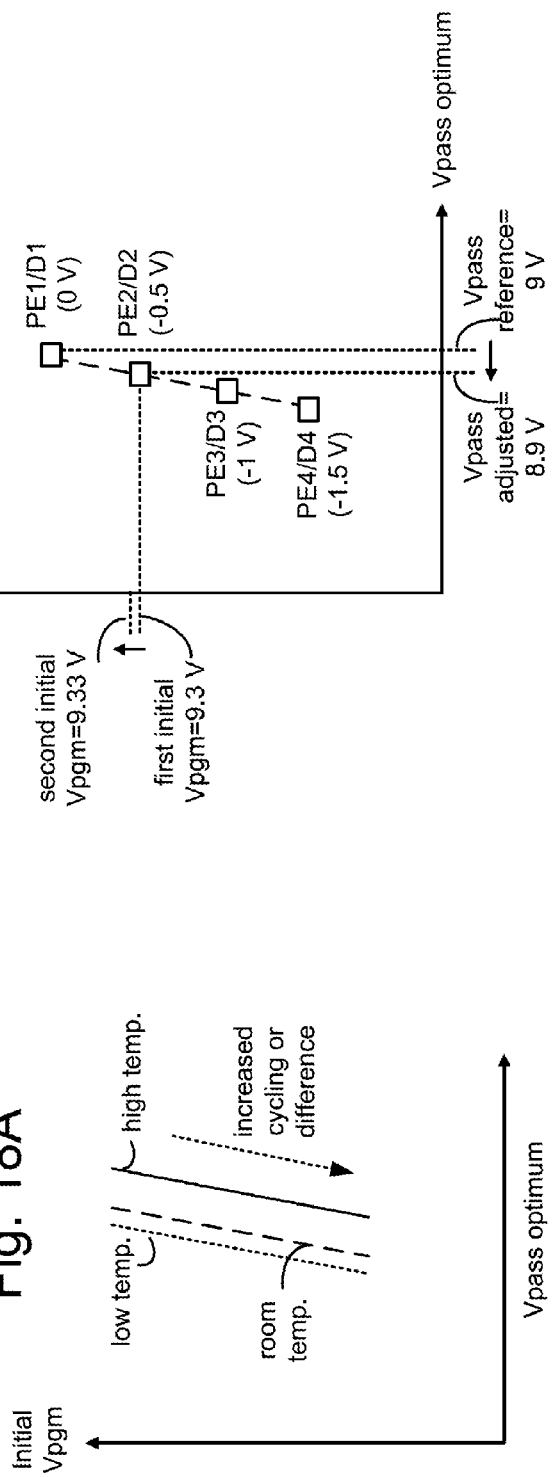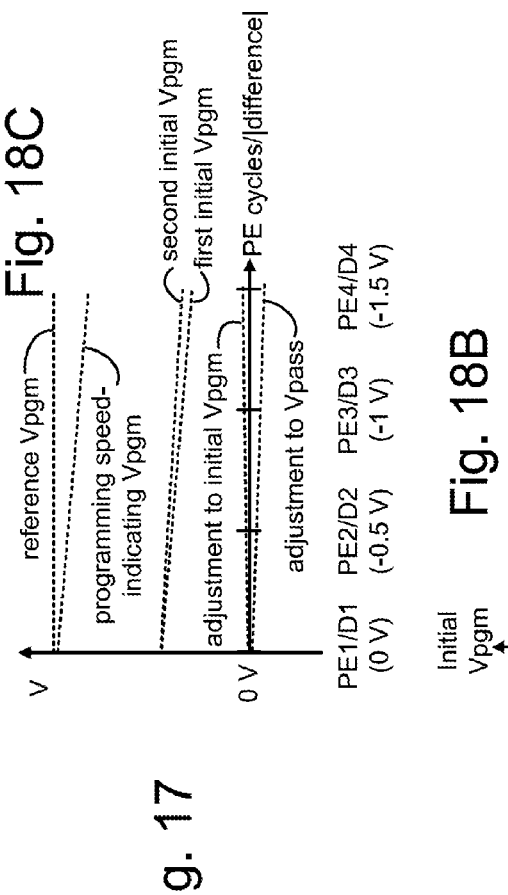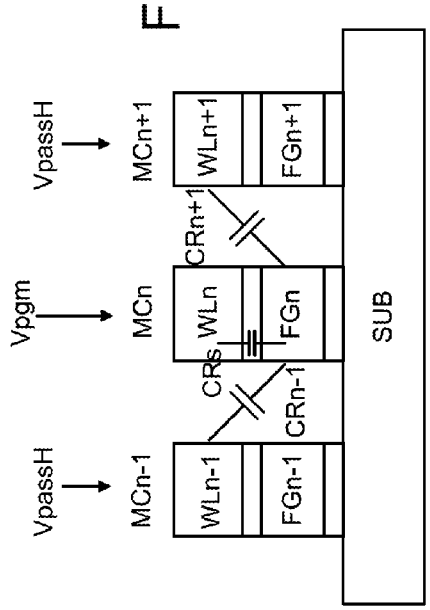

_US 9,123,424 B2_

OPTIMIZING PASS VOLTAGE AND INITIAL PROGRAM VOLTAGE BASED ON PERFORMANCE OF NON-VOLATILE MEMORY

BACKGROUND

The present technology relates to non-volatile memory.

Semiconductor memory devices have become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories.

In such memory devices, a memory cell can include a floating gate that is positioned above and insulated from a channel region in a semiconductor substrate, in a two-dimensional (2D) NAND configuration. The floating gate is positioned between source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

A memory cell can have a floating gate that is used to store two or more ranges of charges, where each range represents a data state.

Moreover, ultra high density storage devices have been proposed using a 3D stacked memory structure which is formed from an array of alternating conductive and dielectric layers. One example is the Bit Cost Scalable (BiCS) architecture. A memory hole is drilled in the layers, and a NAND string is formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Techniques are need for accurately programming a memory device.

BRIEF DESCRIPTION OF THE DRAWINGS

FIG. 5B depicts an unselected NAND string, showing a program voltage applied to a selected word line, and pass voltages applied to unselected word lines.

FIG. 5C depicts a plot of channel potential versus position along the NAND string of FIG. 5B.

FIG. 6A depicts a plot of a number of failed bits versus Vpass for different levels of program-erase cycles, and for a low temperature.

FIG. 6B depicts a plot of a number of failed bits versus Vpass for different levels of program-erase cycles, and for a room temperature.

FIG. 6C depicts a plot of a number of failed bits versus Vpass for different levels of program-erase cycles, and for a high temperature.

FIG. 6D depicts a plot of optimum Vpass versus temperature, for a given level of program-erase cycles.

FIG. 7 depicts an example word line order of a three-pass programming sequence.

FIG. 8A depicts a starting threshold distribution of an example two-pass programming operation.

FIG. 8B depicts a threshold distribution which results after a first pass of the example two-pass programming operation of FIG. 8A.

FIG. 8C depicts a threshold distribution which results after a second pass of the example two-pass programming operation of FIG. 8A.

FIG. 9A depicts a starting threshold distribution of an example three-pass programming operation.

FIG. 9B depicts a threshold distribution which results after a first pass of the example three-pass programming operation of FIG. 9A.

FIG. 9C depicts a threshold distribution which results after a second pass of the example three-pass programming operation of FIG. 9A.

FIG. 9D depicts a threshold distribution which results after a third pass of the example three-pass programming operation of FIG. 9A.

FIG. 11A depicts a starting threshold distribution of another example three-pass programming operation.

FIG. 11B depicts a threshold distribution which results after a first pass of the example three-pass programming operation of FIG. 11A.

FIG. 11C depicts a threshold distribution which results after a second pass of the example three-pass programming operation of FIG. 11A.

FIG. 11D depicts a threshold distribution which results after a third pass of the example three-pass programming operation of FIG. 11A.

FIG. 12A depicts a programming operation in which an initial Vpgm and a pass voltage are optimized.

FIG. 12B depicts details of an example programming operation consistent with FIG. 12A.

FIG. 12C depicts a third programming pass which can be performed after the first and second programming passes of FIG. 12B.

FIG. 14 depicts a series of program-verify iterations in an example of a foggy programming pass, consistent with FIG. 9C.

FIG. 15 depicts a series of program-verify iterations in an example of a fine programming pass, consistent with FIG. 9D.

FIG. 16A depicts example voltages in a programming operation for a fresh set of memory cells.

FIG. 16B depicts example voltages in a programming operation for a moderately cycled set of memory cells.

FIG. 16C depicts example voltages in a programming operation for a heavily cycled set of memory cells.

FIG. 17 depicts an effect of Vpass on programming of a selected memory cell MCn.

FIG. 18A is a plot showing a correspondence between initial Vpgm and Vpass optimum, consistent with FIG. 6A-6C.

FIG. 18B is a plot of the room temperature case of FIG. 18A, showing how Vpass adjusted and Vpgm adjusted for a detected level of a difference between a representative Vpgm and a reference Vpgm.

FIG. 18C is a plot showing various voltages using in a multi-pass programming operation, as a function of PE cycles or of the difference D of FIG. 18B.

DETAILED DESCRIPTION

Programming techniques are provided which minimize program disturb in a memory device. The techniques account for performance variations in a set of memory cell due to factors such as cycling as well as performance variations among different sets of memory cells.

During a programming operation, data can be programmed into memory cells in multiple programming passes. The programming increases the threshold voltages of the memory cells according to a data states which are to be programmed into the cells. In some cases, a back and forth word line order is used in which one word line is partly programmed, then another word line is partly programmed and so forth, until all word lines are fully programmed. This approach can minimize capacitive coupling effects which could inadvertently change the threshold voltages of the memory cells. Moreover, in a given program-verify iteration, some memory cells are selected for programming while others are unselected. The NAND strings of the unselected memory cells are inhibited from being programmed by boosting a substrate channel region under the NAND strings. This boosting is achieved by applying voltages referred to as pass voltages on the unselected word lines. The pass voltage should be sufficiently high to boost the channel to a level which prevents inadvertent programming of the unselected memory cells by capacitive coupling from the program voltage applied on the selected word line. However, if the pass voltages are too high, they can inadvertently program of the unselected memory cells. An optimum pass voltage can be selected.

However, the performance of memory cells can change over time due to factors such as cycling, e.g., the accumulation of program-erase cycles are the memory device is used. Also, there can be performance variations among different sets of memory cells such as on different word lines. In some cases, program voltages such as the initial program voltage are adjusted based on these changes to avoid over programming and to achieve narrow Vth distributions. Programming techniques provided herein modify both the initial program voltage and the pass voltage based on the current performance of set of memory cells. Moreover, the initial program voltage is further modified to compensate for the change in the pass voltage.

Figure 1:
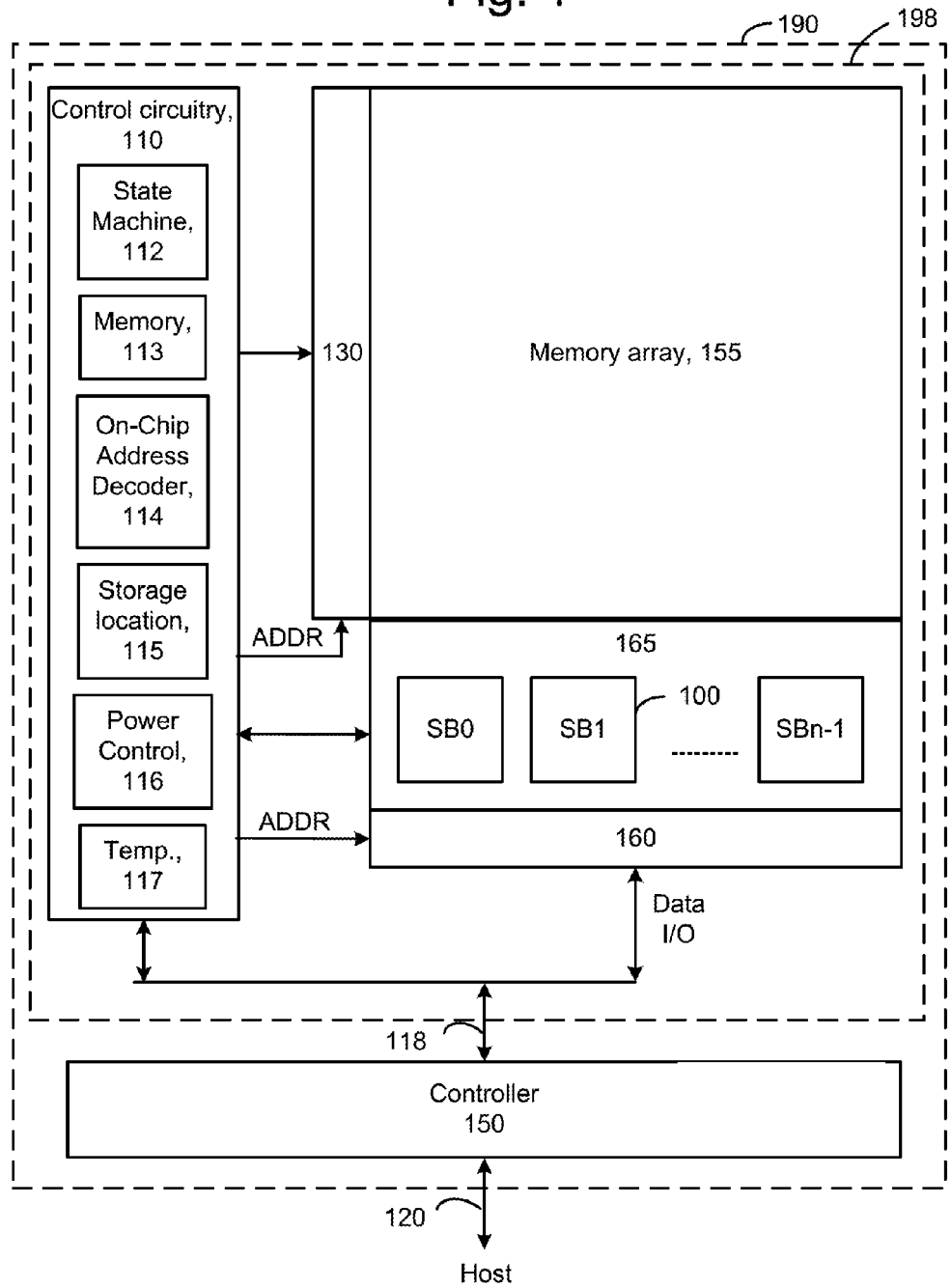
FIG. 1 is a block diagram of a non-volatile memory system using single row/column decoders and read/write circuits.

FIG. 1 is a block diagram of a non-volatile memory system using single row/column decoders and read/write circuits. The diagram illustrates a memory device 190 having read/write circuits for reading and programming a page of memory cells in parallel, according to one embodiment. Memory device 190 may include one or more memory die 198. Memory die 198 includes a two-dimensional memory array 155 of memory cells or storage elements, control circuitry 110, and read/write circuits 165.

In some embodiments, the array of memory cells can be three dimensional. The memory array 155 is addressable by word lines via a row decoder 130 and by bit lines via a column decoder 160. The read/write circuits 165 include multiple sense blocks 100 and allow a page of memory cells to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

A storage location 115 such as a data register can be used to store data for programming. A temperature circuit 117 provides an indication of temperature in the memory device. In one possible approach, a band gap circuit is used.

One or more of the components (alone or in combination), other than memory array 155, can be thought of as a managing or control circuit. For example, one or more control circuits may include any one of, or a combination of, control circuitry 110, state machine 112, address decoder 114, column decoder 160, power control module 116, temperature circuit 117, sense blocks 100 (including the processor 192 and managing circuit MC0 in FIG. 3), read/write circuits 165, and controller 150, and so forth. The sense block 100 is discussed further in connection with FIG. 3.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
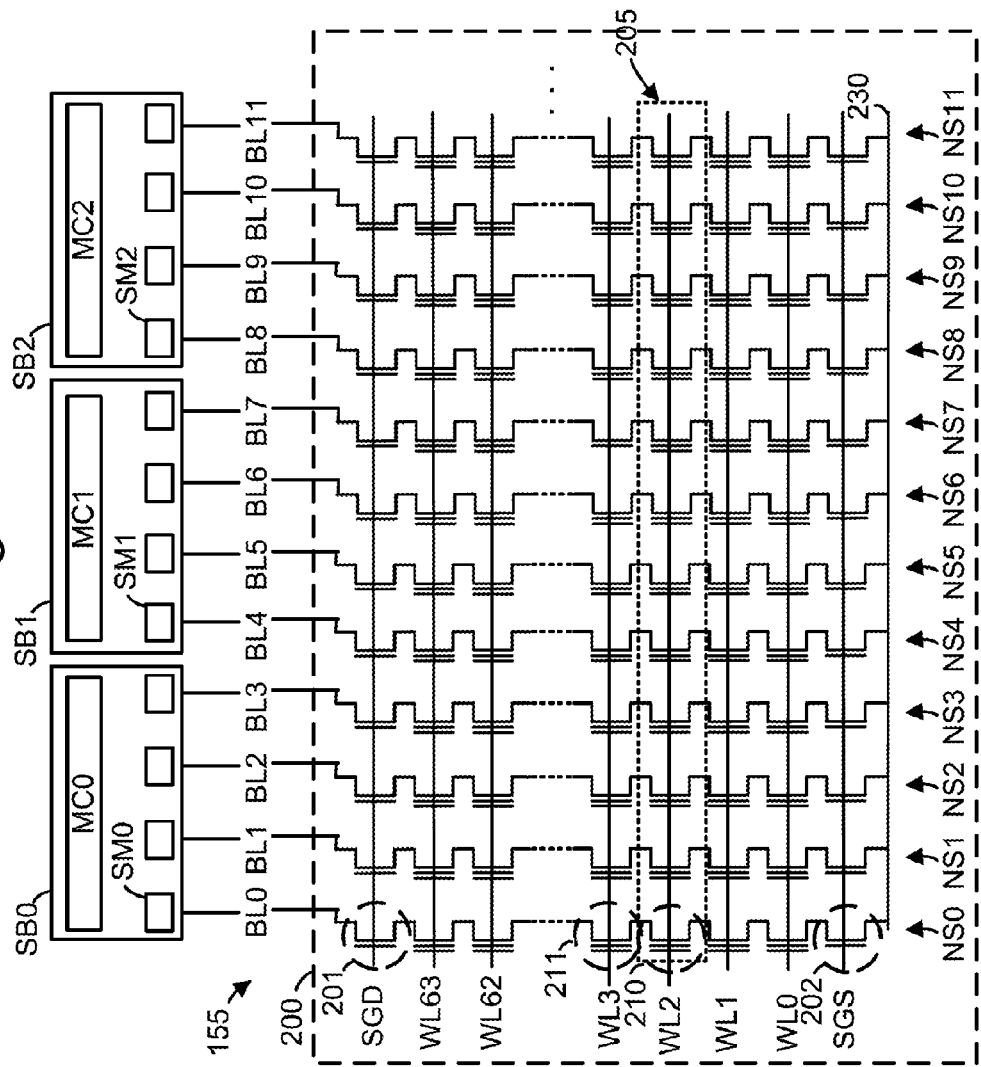
FIG. 2 depicts a block of NAND flash memory cells in the memory array 155 of FIG. 1 and associated sense blocks SB0, SB1 and SB2.

FIG. 2 depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 230. For example, NS0 includes a source side select gate transistor 202 and a drain side select gate transistor 201. An example set 205 of memory cells, including a memory cells 210, are connected to WL2. For example, WL2 could be a selected word line which is currently selected for programming and the example memory cells can be selected memory cells which are currently selected for programming. Other memory cells connected to WL3 can also be selected memory cells. An example unselected memory cell 211 is connected to an unselected word line WL3. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge memory cell in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
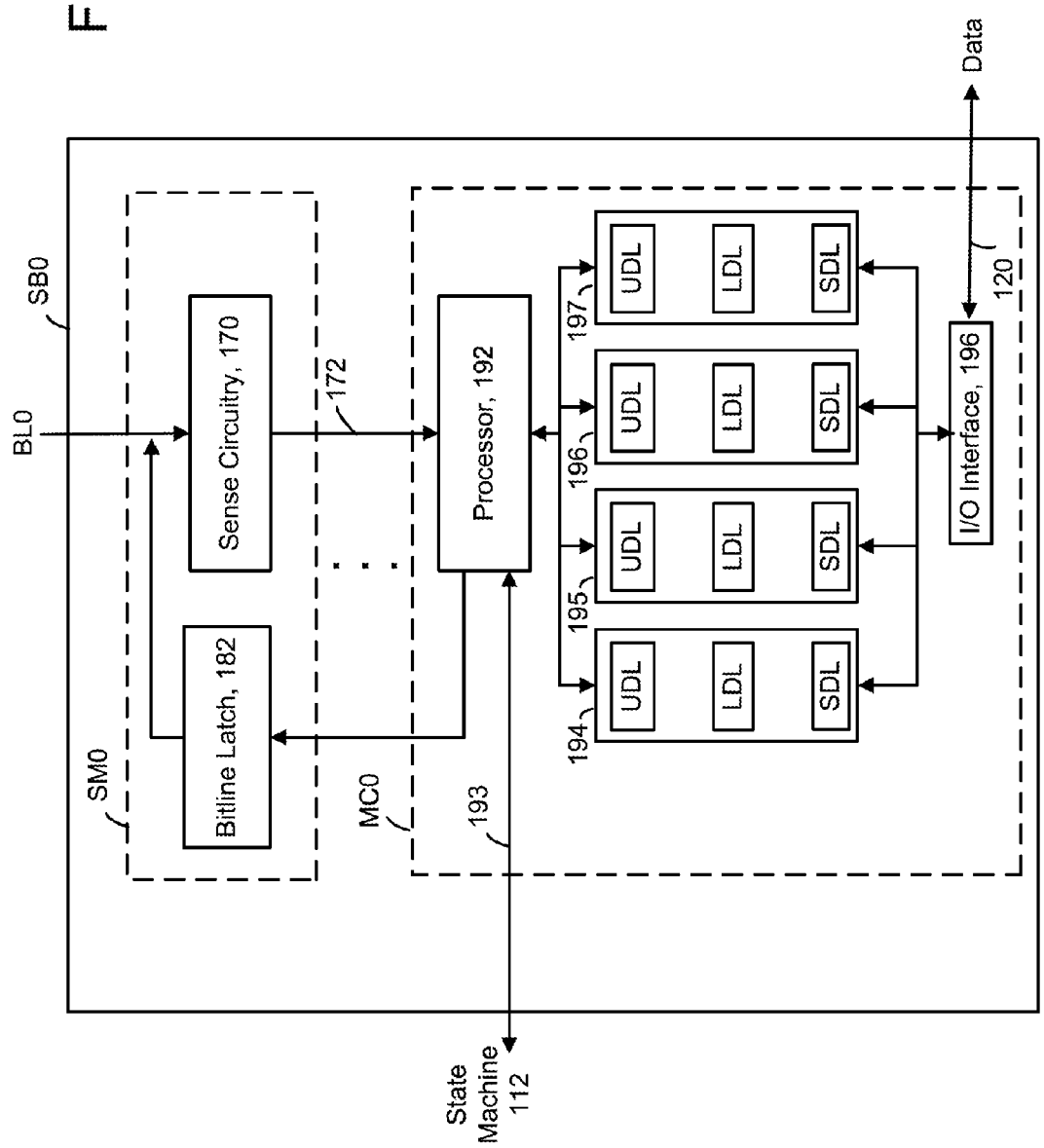
FIG. 3 is a block diagram depicting one embodiment of the sense block SB0 of FIG. 1.

FIG. 3 is a block diagram depicting one embodiment of the sense block SB0 of FIG. 1. The sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of memory cells.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches 194-197 and an I/O Interface 196 coupled between the set of data latches 194 and data bus 120. One set of data latches can be provide for each sense module, and data latches identified by SDL, LDL and UDL may be provided for each set. LDL stores a bit for a lower page (LP) of write data, and UDL stores a bit for an upper page (UP) of write data, in a memory which stores two bits of data in each memory cell. SDL stores a bit from a read of a memory cell. During a read operation, the SDL latch first receives the bit and optionally can transfer the bit to the other data latches. Moreover, in one approach, LDL is the only data latch the control circuitry can access so that the LP and UP data are toggled out from the LP latch during a read.

Additional data latches could be used as well. For example, in a three-bit per memory cell implementation, one extra data latch may be used to store a middle page (MP) of data. A four-bit per memory cell implementation can use lower-middle and upper-middle data latches.

Processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of program voltage pulses applied to the control gates of the addressed memory cells. Each program pulse is followed by a read back (verify) to determine if the memory cell has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated memory cell has reached certain mileposts in a programming operation. For example, data latches may identify that the Vth of a memory cell is below a particular verify level. The data latches indicate whether a memory cell currently stores one or more bits from a page of data. For example, an LP data latch is flipped (e.g., from 0 to 1) when a lower page bit is stored in an associated memory cell. An UP data latch is flipped when an upper page bit is stored in an associated memory cell. The flipping of a bit occurs when an associated memory cell completes programming, e.g., when its Vth exceeds a target verify level. When lower, middle and upper page bits are used (e.g., in case of three-bit per memory cell memory), the MP data latch is also flipped when a middle page bit is stored in an associated memory cell.

Figure 4:
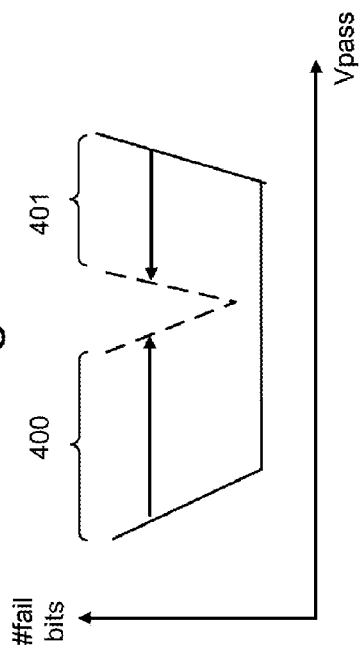
FIG. 4 depicts a plot of a number of failed bits versus Vpass, showing the effects of scaling of a memory device.

FIG. 4 depicts a plot of a number of failed bits versus Vpass, showing the effects of scaling of a memory device. The solid line represents the case of a memory device which is less scaled (e.g., has larger dimensions). This is a more relaxed case, since there is a wide range of Vpass values which result in a minimum number of fail bits. The dashed line represents the case of a memory device which is more scaled (e.g., has smaller dimensions). This is a more difficult case, since Vpass should be more carefully controlled to minimize the number of fail bits. A fail bit is a memory cell which is not accurately programmed due to program disturb, such that the intended data state of the cell cannot be read from the cell. Typically, the next higher data state is read such as in an Er to A state failure, where a cell which is intended to remain in the erased state is inadvertently is programmed to the A state.

For the more scaled case, in a region 400, Vpass is low and provides insufficient channel boosting in the channel regions of the selected NAND strings. In a region 401, Vpass is high and may cause program disturb for the unselected memory cells. This is a problem of insufficient Vpass margin for a scaled NAND device. Vpass is important for realizing simultaneous programming of multiple cells, e.g., representing a page of data (a unit of write data), which are connected to a single word line in NAND flash memory. Vpass plays an important role in a programming operation because a page consists of both program "0" and program inhibit "1" cells. Vpass cannot be too low or too high as both cases can result in significant program inhibit failures. A safe operation margin for Vpass will become smaller as memory devices are scaled down.

Figure 5A:
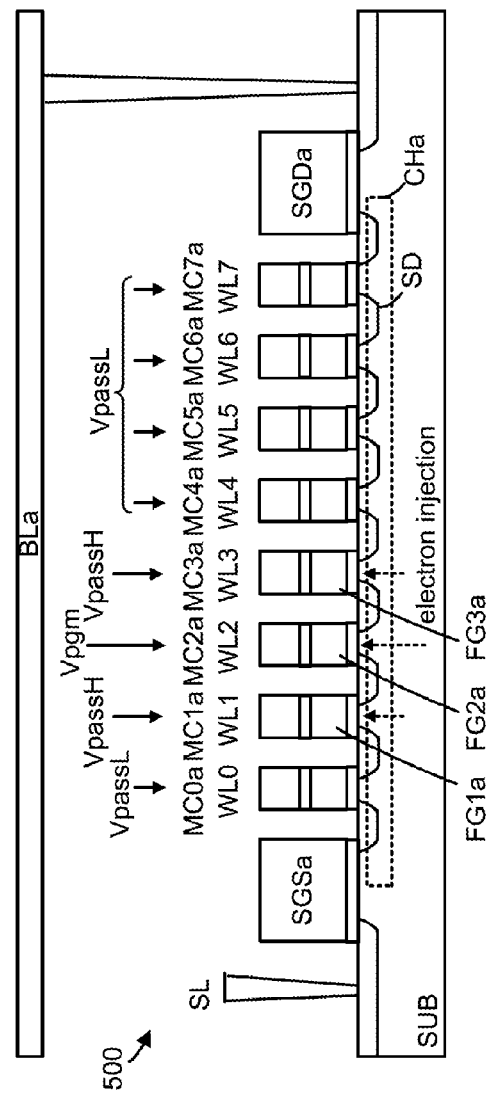
FIG. 5A depicts a selected NAND string, showing a program voltage (Vpgm) applied to a selected word line, and lower and higher pass voltages (VpassL and VPassH) applied to unselected word lines.

FIG. 5A depicts a selected NAND string, showing a program voltage (Vpgm) applied to a selected word line, and lower and higher pass voltages (VpassL and VPassH) applied to unselected word lines. The NAND string 500 includes a number of memory cells MC0a-MC7a connected to word lines WL0-WL7, respectively. A source-side select gate (SGSa) transistor is at one end of the NAND string and a drain-side select gate (SGDa) transistor is at another end of the NAND string. Source/drain regions (SD) in a substrate (SUB) are provided between the transistors. A channel region (CHa) can be formed in the substrate during programming by providing a voltage on each word line which renders the memory cells in a conductive or on state. For example, the selected word line, WL2 in this example, receives a program voltage Vpgm, the unselected word lines adjacent to the selected word line (WL1 and WL3 in this example) receive a higher pass voltage VpassH and the remaining word lines, which are non-adjacent to the selected word line, (WL0 and WL4-WL7 in this example) receive a lower pass voltage VpassL.

In one example, VpassH is about 9-10 V, VpassL is about 4-7 V and Vpgm ranges from about 10-25 V. SGSa may be at 0 V while the source line SL may be about 1.5 V so that the SGSa transistor is non-conductive. SGDa is at about 2 V while BLa is at 0 V so that the SGDa transistor is conductive and the channel region communicates with the bit line BLa. The channel voltage may therefore be equal to the bit line voltage. Program disturb can occur for the unselected memory cells in the selected word line due to a high Vpass. In particular, the Vpass level of the adjacent word lines can result in inadvertent Fowler-Nordheim programming for MC1a, the source side neighbor of the selected cell MC2a, and MC3a, the drain side neighbor of the selected cell. This inadvertent programming is represented by the shorter dashed arrows under MC1a and MC3a. This programming involves electron injection from the substrate into the floating gates FG1a and FG3a of the cells. The intentional programming of MC2a is represented by the longer dashed arrow under MC2a. This programming involves electron injection from the substrate into the floating gate FG2a of the cell.

FIG. 5B depicts an unselected NAND string, showing a program voltage applied to a selected word line, and pass voltages applied to unselected word lines. The NAND string 520 includes a number of memory cells MC0b-MC7b connected to word lines WL0-WL7, respectively. A source-side select gate (SGSb) transistor is at one end of the NAND string and a drain-side select gate (SGDb) transistor is at another end of the NAND string. A channel region (CHb) can be formed in the substrate during programming by providing a voltage on each word line which renders the memory cells in a conductive or on state. SGSb may be at the same voltage as SGSa while the source line SL is also common to the NAND strings in a block, so that the SGSb transistor is non-conductive. SGDb may be at the same voltage as SGDa while BLa is at 0 V so that the SGDb transistor is non-conductive and the channel region does not communicate with the bit line BLb. The channel region therefore floats and can be boosted due to capacitive coupling from the pass voltages and Vpgm.

FIG. 5C depicts a plot of channel potential versus position along the NAND string of FIG. 5B. The solid line represents the case of a high Vpass on the adjacent word line of the selected word line. The dashed line represents the case of a low Vpass on the adjacent word line of the selected word line. For the case of a low Vpass, program disturb can occur for MC2b, an unselected cell which is connected to the selected word line, due to insufficient channel boosting. Essentially, the channel boosting level under MC2b is not high enough to counteract a programming effect of Vpgm. As a result, inadvertent electron injection into the floating gate FG2b of MC2b can occur. This shows why precise control of Vpass and Vpgm is important.

FIG. 6A depicts a plot of a number of failed bits versus Vpass for different levels of program-erase cycles, and for a low temperature. "Cycling" represents the accumulation of program-erase cycles (a cycle of programming followed by erase), such that the bottom plot represents a fresh device, the top plot represents a heavily cycled device and the intermediate plots represent intermediate levels of program-erase cycles. Each plot has a minimum denoted by a square symbol. This is the optimum Vpass for that level of program-erase cycles. The optimum Vpass shifts to a lower level in proportion to an increase in the level of program-erase cycles. This phenomenon is understood to be due to an increase in the neutral threshold voltage due to stress caused by cycling. This window narrowing effect is enhanced by excessive charge trapping within the floating gate surroundings, such as the tunnel oxide interface, channel edges and gate edge corners. Ideally, Vpass is dynamically selected for a programming operation based on the current performance level of the memory cells due to cycling, temperature or other factors.

As described further below, increased cycling corresponds to an increased difference (D) between a programming speed-indicating program voltage and a reference program voltage. In FIG. 6A-6C, PE1 denotes a fresh memory device (e.g., zero cycles) and D1 denotes a corresponding difference. PE2, PE3 and PE4 denote increasing cycles and D2, D3 and D4, respectively, denote corresponding differences.

FIG. 6B depicts a plot of a number of failed bits versus Vpass for different levels of program-erase cycles, and for a room temperature. The trend is similar to FIG. 6A but with movement to a higher number of fail bits and a higher Vpass.

FIG. 6C depicts a plot of a number of failed bits versus Vpass for different levels of program-erase cycles, and for a high temperature. The trend is similar to FIG. 6B but with movement to a higher number of fail bits and a higher Vpass.

FIG. 6D depicts a plot of optimum Vpass versus temperature, for a given level of program-erase cycles. Generally, the optimum Vpass can increase as temperature increases.

FIG. 7 depicts an example word line order of a three-pass programming sequence. This is an example of programming three bits per cell. In this example, each word line is programmed in three passes in the order depicted. For example, the first pass is performed for WL0 (step 1), the first pass is performed for WL1 (step 2), the second pass is performed for WL0 (step 3) and so forth. The use of such a back and forth word line programming order can reduce floating gate-to-floating gate coupling.

Examples of multi-pass programming schemes are discussed below. In one approach, the first pass is a foggy programming pass and the second pass is a fine programming pass. In another approach, the first pass is an intermediate pass, the second pass is a foggy programming pass and the third pass is a fine programming pass.

The techniques provided herein can be used, e.g., with programming operations having two or more programming passes.

Under a three-pass programming sequence, the program speed of the memory cells of each word line can be acquired from the first, rough programming pass, in one approach. The programming speed for each WL at each programming incident can be simultaneously acquired from the first programming pass by identifying the Vpgm that is required for the Vth distribution to reach to a certain verify Vth or check point Vth. This Vpgm for WLn will be stored in a latch for subsequent use in the second and third programming passes. This allows us to precisely optimize the Vpgm start bias for the second and third programming passes. This method solves two problems. First, the variation in program speed for each WL can be optimized, so that over programming and program speed variations can be suppressed. Second, a program speed increase due to the program-erase window narrowing effect can be compensated by lowering Vpgm as the memory cells degrade. A two bit per cell implementation is similar to the three bit per cell implementation, but may omit the foggy programming pass.

FIG. 8A depicts a starting threshold distribution of an example two-pass programming operation. Initially, the cells are all in the erased (Er) state as represented by the threshold distribution (Vth) distribution 800. The vertical axis indicates the number of cells and the horizontal axis indicates a Vth.

FIG. 8B depicts a threshold distribution which results after a first pass of the example two-pass programming operation of FIG. 8A. Based on write data, the cells which are to remain in the Er state are represented by the Vth distribution 800, while the cells which are to be programmed to the A, B and C states are represented by the Vth distributions 810, 812 and 814, respectively. This programming pass may be referred to as a foggy pass in which verify levels of VvA_foggy, VvB_foggy and VvC_foggy are used. In this pass, the Vth distributions are relatively wide but close to the final level.

FIG. 8C depicts a threshold distribution which results after a second pass of the example two-pass programming operation of FIG. 8A. Based on the write data, the cells which are to remain in the Er state are represented by the Vth distribution 800, while the cells which are to be programmed to the A, B and C states are represented by the Vth distributions 811, 813 and 815, respectively. This programming pass may be referred to as a fine pass in which verify levels of VvA, VvB and VvC are used. In this pass, the Vth distributions are relatively narrow and have reached the final levels. The programming from the foggy level to the fine level represents a small increase in Vth which avoids disturbs. Read levels VrA, VrB and VrC are used to read the cells. Each data state represents two bits of data as indicated.

FIG. 9A depicts a starting threshold distribution of an example three-pass programming operation. Initially, the cells are all in the erased (Er) state as represented by the threshold distribution (Vth) distribution 900. The vertical axis indicates the number of cells and the horizontal axis indicates a Vth.

FIG. 9B depicts a threshold distribution which results after a first pass of the example three-pass programming operation of FIG. 9A. Based on write data as indicated, the cells which are to remain in the Er state, or programmed to the A state, are represented by the Vth distribution 900, while the cells which are to be programmed to the B and C states are programmed to an intermediate (INT) distribution 902. This programming pass may be referred to as an intermediate pass in which a verify level of VvINT is used.

FIG. 9C depicts a threshold distribution which results after a second pass of the example three-pass programming operation of FIG. 9A. Based on write data as indicated, the cells which are to remain in the Er state are represented by the Vth distribution 900. The cells which are to be programmed to the A state are represented by the distribution 910. The cells which are to be programmed to the B and C states are represented by the distributions 912 and 914, respectively. This programming pass may be referred to as a foggy pass in which verify levels of VvA_foggy, VvB_foggy and VvC_foggy are used. Each data state represents two bits of data as indicated.

FIG. 9D depicts a threshold distribution which results after a third pass of the example three-pass programming operation of FIG. 9A. Based on the write data as indicated, the cells which are to remain in the Er state are represented by the Vth distribution 900, while the cells which are to be programmed to the A, B and C states are represented by the Vth distributions 911, 913 and 915, respectively. This programming pass may be referred to as a fine pass in which verify levels of VvA, VvB and VvC are used.

In a two-pass programming operation, FIG. 9C could be omitted so that the distributions of FIG. 9D follow the distributions of FIG. 9B directly.

Figure 10A:
FIG. 10A depicts a starting threshold distribution of another example three-pass programming operation.

FIG. 10A depicts a starting threshold distribution of another example three-pass programming operation. Initially, the cells are all in the erased (Er) state as represented by the threshold distribution (Vth) distribution 1000. The vertical axis indicates the number of cells and the horizontal axis indicates a Vth.

Figure 10B:
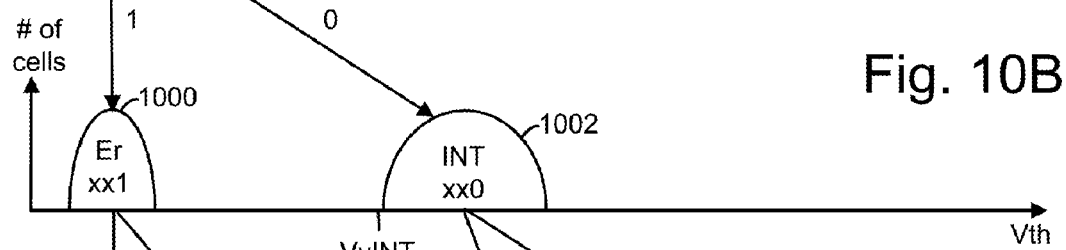
FIG. 10B depicts a threshold distribution which results after a first pass of the example three-pass programming operation of FIG. 10A.

FIG. 10B depicts a threshold distribution which results after a first pass of the example three-pass programming operation of FIG. 10A. Based on write data as indicated, the cells which are to remain in the Er state, or programmed to the A, B and C states, are represented by the Vth distribution 1000, while the cells which are to be programmed to the D, E, F and G states are programmed to an intermediate (INT) distribution 1002. This programming pass may be referred to as an first intermediate pass in which a verify level of VvINT is used.

Figure 10C:
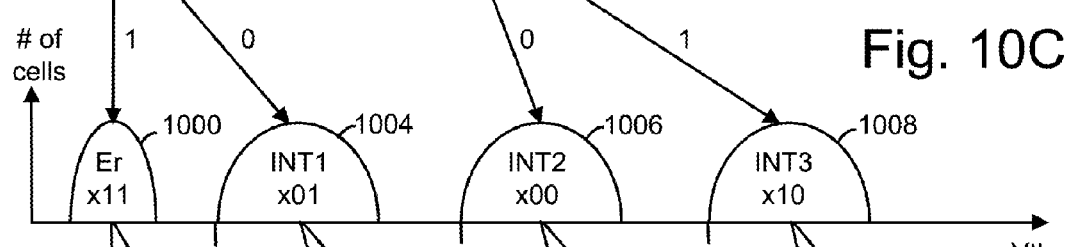
FIG. 10C depicts a threshold distribution which results after a second pass of the example three-pass programming operation of FIG. 10A.

FIG. 10C depicts a threshold distribution which results after a second pass of the example three-pass programming operation of FIG. 10A. Based on write data as indicated, the cells which are to remain in the Er state, or programmed to the A state, are represented by the Vth distribution 1000. The cells which are to be programmed to the B and C states are programmed to a first intermediate (INT1) distribution 1004. The cells which are to be programmed to the D and E states are programmed to a second intermediate (INT2) distribution 1006. The cells which are to be programmed to the F and G states are programmed to a third intermediate (INT3) distribution 1008. This programming pass may be referred to as a second intermediate pass in which verify levels of VvINT1, VvINT2 and VvINT3 are used.

Figure 10D:
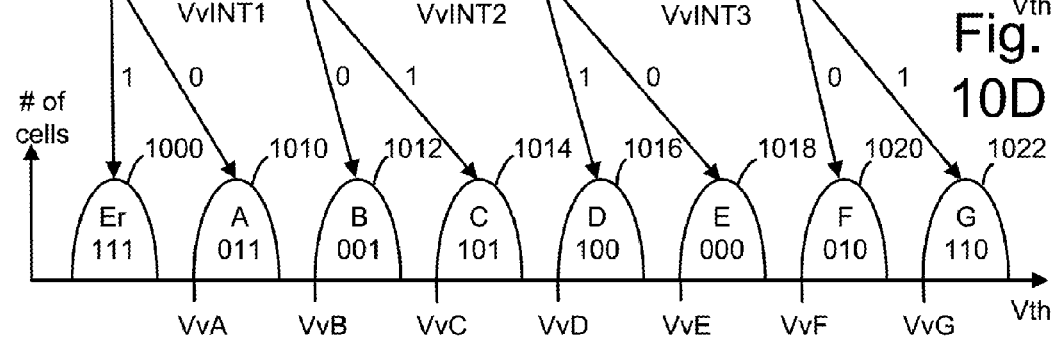
FIG. 10D depicts a threshold distribution which results after a third pass of the example three-pass programming operation of FIG. 10A.

FIG. 10D depicts a threshold distribution which results after a third pass of the example three-pass programming operation of FIG. 10A. Based on the write data as indicated, the cells which are to remain in the Er state are represented by the Vth distribution 1000, while the cells which are to be programmed to the A, B, C, D, E, F and G states are represented by the Vth distributions 1010, 1012, 1014, 1016, 1018, 1020 and 1022, respectively. This programming pass uses verify levels of VvA, VvB, VvC, VvD, VvE, VvF and VvG. Each data state represents three bits of data as indicated.

The programming operation of FIG. 10A-10D could be modified to include an additional programming pass between the distributions of FIGS. 10C and 10D. This additional programming pass would result in foggy Vth distributions for each of the data states, in which case FIG. 10D would represent the fine Vth distributions. This would be a four-pass programming operation.

FIG. 11A depicts a starting threshold distribution of another example three-pass programming operation. Initially, the cells are all in the erased (Er) state as represented by the threshold distribution (Vth) distribution 1100. The vertical axis indicates the number of cells and the horizontal axis indicates a Vth.

FIG. 11B depicts a threshold distribution which results after a first pass of the example three-pass programming operation of FIG. 11A. Based on write data as indicated, the cells which are to remain in the Er state, or programmed to the A, B and C states, are represented by the Vth distribution 1100, while the cells which are to be programmed to the D, E, F and G states are programmed to an intermediate (INT) distribution 1102. This programming pass may be referred to as an intermediate pass in which a verify level of VvINT is used.

FIG. 11C depicts a threshold distribution which results after a second pass of the example three-pass programming operation of FIG. 11A. Based on the write data as indicated, the cells which are to remain in the Er state are represented by the Vth distribution 1100. The cells which are to be programmed to the A, B and C states are represented by the Vth distributions 1110, 1112 and 1114, respectively. The cells which are to be programmed to the D, E, F and G states are represented by the Vth distributions 1116, 1118, 1120 and 1122, respectively. This programming pass may be referred to as a foggy pass in which verify levels of VvA_foggy-VvG_foggy are used. Each data state represents three bits of data as indicated.

FIG. 11D depicts a threshold distribution which results after a third pass of the example three-pass programming operation of FIG. 11A. Based on the write data as indicated, the cells which are to remain in the Er state are represented by the Vth distribution 1100, while the cells which are to be programmed to the A, B, C, D, E, F and G states are represented by the Vth distributions 1111, 1113, 1115, 1117, 1119, 1121 and 1123, respectively. This programming pass may be referred to as a fine pass in which verify levels of VvA, VvB, VvC, VvD, VvE, VvF and VvG are used.

FIG. 12A depicts a programming operation in which a program voltage and a pass voltage are optimized. Step 1200 involves performing one programming pass for a set of memory cells by applying a first set of step-wise increasing program voltages to a selected word line and applying a first Vpass (pass voltage) to unselected word lines. For example, a programming pass can comprises a series of program-verify iterations, where each iteration comprises a program portion in which the program pulse is applied to the selected word line while the first pass voltage is applied to one or more of the unselected word lines, followed by a verify portion in which a verify (sensing) operation is performed by applying a verify pulse to the selected word line and activating sensing circuitry. Step 1201 involves determining a programming speed-indicating Vpgm from the first programming pass. This is an example of a representative Vpgm or a performance metric of the set of memory cells. For example, this can be a final Vpgm (final program voltage) of the first set of step-wise increasing program voltages, or a Vpgm at a programming milestone of the programming pass, as discussed further below. The programming milestone can occur when a specified number of memory cells have a Vth that exceeds a threshold.

The programming speed-indicating Vpgm of the first set of step-wise increasing program voltages indicates a programming speed of the set of memory cells during the one programming pass. For example, in the case of the final Vpgm, a higher final Vpgm indicates that relatively slower programming has occurred, e.g., the memory cells are relatively hard to program. This could be the case for a fresh memory device with few cycles. A lower final Vpgm indicates that relatively faster programming as occurred, e.g., the memory cells are relatively easy to program. This could be the case for a moderately or heavily cycled memory device. Programming speed could vary based on other factors as well such as temperature of other environmental factors.

The programming speed-indicating Vpgm can be obtained in one programming pass, stored in a storage location such as a latch and retrieved in a subsequent programming pass.

Step 1202 involves determining an adjusted Vpass (an adjusted pass voltage) for another programming pass by adjusting a reference Vpass based on the programming speed-indicating Vpgm. The reference Vpass can be, e.g., the first Vpass or some other preset value which differs from the first Vpass. The reference Vpass can be independent of the programming speed-indicating Vpgm.

The adjustment to the reference Vpass can be determined as discussed further below. In one approach, the adjustment is based on a difference between a reference Vpgm and the programming speed-indicating Vpgm. The reference Vpgm can be a preset level which indicates a reference level of programming speed. The reference Vpgm can be independent of the programming speed-indicating Vpgm. For example, the reference Vpgm can represent a final or other milestone voltage which would be expected for an average fresh set of memory cells.

If the programming speed-indicating Vpgm is greater than the reference Vpgm, this indicates the set of memory cells has a slower programming speed than the average fresh set of memory cells. If the programming speed-indicating Vpgm is less than the reference Vpgm, this indicates the set of memory cells has a faster programming speed than the average fresh set of memory cells. The adjustment to the reference Vpass can be based on a difference between the reference Vpgm and the programming speed-indicating Vpgm, as this gives an indication of how far the current programming speed differs from the speed of a fresh set of memory cells. The adjustment can be a linear or non-linear function of the difference. In one approach, the adjustment is obtained by multiplying the difference by a multiplier of less than one.

Step 1203 involves determining a first initial Vpgm for the another programming pass based on the programming speed-indicating Vpgm. For example, the first initial Vpgm can be obtained by subtracting an offset from the programming speed-indicating Vpgm or based on some other linear or non-linear function of the programming speed-indicating Vpgm.

Step 1204 involves determining an adjustment to the first initial Vpgm based on the adjustment to the reference Vpass, to provide a second initial Vpgm. For example, the adjustment to the first initial Vpgm can be a fraction, less than one, of the adjustment to the reference Vpass. Generally, the adjustment to the first initial value has a smaller magnitude than the adjustment to the reference pass voltage because a relatively large change in Vpass can be counteracted by a relatively small change in Vpgm. In one approach, the adjustment to the reference Vpass is of opposite polarity to the adjustment to the first initial value. That is, if the adjustment to Vpass is positive, the adjustment to Vpgm should be negative. If the adjustment to Vpass is negative, the adjustment to Vpgm should be positive. Subsequently, another programming pass can be performed using the second initial Vpgm.

This approach recognizes that Vpass and initial Vpgm can be adaptively set in each programming pass based on programming speed in a prior programming pass. Further, the initial Vpgm be adaptively adjusted based on the adjustment to Vpass.

Note that, in general, the programming speed-indicating Vpgm can be obtained from any programming pass in a programming operation and used in any later programming pass of the same programming operation, or even another, subsequent programming operation.

A limitation can be applied on the maximum amount of the adjustment to Vpass and the initial Vpgm. This provides a bias offset compliance for the second and third passes. Generally, having a compliance to avoid over compensation may be useful. For example, the first pass may stop programming at a very low final Vpgm due to a very tight process control word line, as an example. In this case, without a limit, the Vpass bias will be much lower than is desirable for the second and third passes. This may cause more program disturb than without any compensation. In another example, there may be cells which are unusually hard to program, so that the Vpass is higher than desired. In such cases, a bias offset compliance helps avoid this problem.

FIG. 12B depicts details of an example programming operation consistent with FIG. 12A. Step 1210 involves configuring a memory device with parameters which are used in the programming process. Appropriate values for these parameters can be determined from testing. The parameters can include, e.g., an initial Vpgm for the first programming pass, a reference Vpgm, an offset for one or more subsequent programming passes (e.g., Voffset_$2^{nd}$ pass, Voffset_$3^{rd}$ pass), a reference Vpass for one or more subsequent programming passes, and tables or equations for adaptively determining, in real time, the initial Vpgm and Vpass in the subsequent programming passes. A first Vpass for the first programming pass, can also be configured if it is different than the reference Vpass.

These are parameters that can be stored in the memory device such as in the storage location 115. Moreover, these parameters can be provided for each of different sets of memory cells such as for each word line in a block and/or for each block in a memory device. In this manner, programming can be customized for each set, block or other unit of memory cells. Furthermore, these parameters can be provided for each programming pass for a set of memory cells. In this manner, programming can be customized for each programming pass.

Generally, the steps can be carried out by a control circuit of the memory device in various ways. In one approach, the steps are carried out by accessing tables which embody the desired relationships between the programming parameters and/or by evaluating equations.

Step 1211 begins a multi-pass programming operation. Step 1212 performs a first programming pass using a first set of step-wise increasing program voltages for a selected word line, WLn, and using the first Vpass on the WLn−1 and WLn+1, the adjacent unselected word lines of WLn. The same Vpass, or a lower Vpass, may be used on the other unselected word lines, in one approach. Step 1213 determines a programming speed-indicating Vpgm of the first programming pass (e.g., a final Vpgm or a Vpgm at a programming milestone). Step 1214 determines a difference between the reference Vpgm and the programming speed-indicating Vpgm. In one approach, the reference Vpgm is subtracted from the programming speed-indicating Vpgm.

Step 1215 determines an adjustment to the reference pass voltage based on the difference, to provide an adjusted Vpass. For example, the adjustment can be obtained as a specified fraction of the difference. Thus, the Vpass is optimized based on the performance of the memory cells in a programming pass, as indicated by the programming speed-indicating Vpgm.

Step 1216 determines a first initial value of Vpgm for a second programming pass as: programming speed-indicating Vpgm−Voffset_$2^{nd}$ pass, as an example. Generally, this first initial value is some function of the programming speed-indicating Vpgm. This first initial value is thus a value which is based on the programming speed of the set of cells, but not based on the Vpass.

Step 1217 determines a second initial value of Vpgm based on the adjustment to the reference Vpass. Generally, this value is some function of the adjustment to the reference Vpass, and is smaller than the adjustment. In one approach, the adjustment to the first initial value is proportional to the adjustment to the reference pass voltage (in magnitude) multiplied by a ratio of: (a) a coupling ratio of at least one unselected word line to floating gates of the memory cells of the set of memory cells (CRn−1, CRn+1), to (b) a coupling ratio of the selected word line to the floating gates of the memory cells of the set of memory cells (CRs), as discussed further below (see, e.g., FIG. 17). Thus, the initial Vpgm for a set of memory cells is optimized based on the performance of the memory cells in a prior programming pass, as indicated by the programming speed-indicating Vpgm.

Step 1218 performs a second programming pass using a second set of step-wise increasing program voltages for WLn, starting from the second initial value of Vpgm, and using the adjusted Vpass on WLn−1 and WLn+1. The Vpass used on the other unselected word lines can be the same as in the first pass, the same as the reference voltage, or some other value.

Note that the adjusted pass voltage can be applied to at least one unselected word line during one or more program voltages of the second set of step-wise increasing program voltages. It can be beneficial, but is not necessary, to apply the adjusted pass voltage during every program voltage of the second set of step-wise increasing program voltages.

FIG. 12C depicts a third programming pass which can be performed after the first and second programming passes of FIG. 12B. Optionally, a third pass or other additional passes can be performed. In one approach, the programming speed-indicating Vpgm from the first pass is used in each successive pass to optimize Vpass and the initial Vpgm. Step 1220 determines an unadjusted initial Vpgm for a third programming pass as: programming speed-indicating Vpgm−offset. The offset can be the same as in the second pass, or different. Step 1221 determines a first initial value of Vpgm for the third programming pass as: programming speed-indicating Vpgm−offset_3rd pass. The parameter offset_3rd pass can be the same as, or different than, Voffset_2nd pass. Step 1222 determines a second initial value of Vpgm based on the adjustment to the reference Vpass, similar to step 1217. The adjustment can be the same, or different than, in step 1217. Step 1223 performs a third programming pass using a third set of step-wise increasing program voltages for WLn, starting from the second initial value of Vpgm, and using the adjusted Vpass on WLn−1 and WLn+1. The Vpass used on the other unselected word lines can be the same as in the first pass, the same as the reference voltage, or some other value.

Figure 13A:
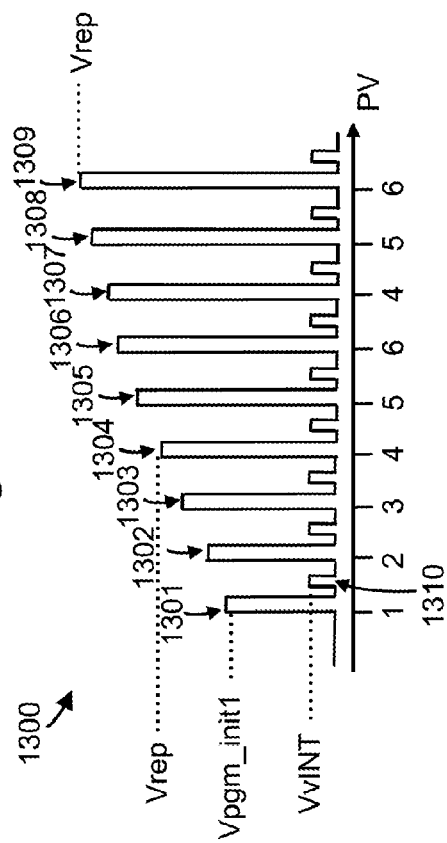
FIG. 13A depicts a series of program-verify iterations in an example of a programming pass for a lower page of data, consistent with FIGS. 8A 9B, 10B and 11B.

FIG. 13A depicts a series of program-verify iterations in an example of a programming pass for a lower page of data, consistent with FIG. 9B. The horizontal axis depicts program verify (PV) iteration number, or time, and the vertical axis depicts voltage. The pulse train 1300 includes a series of program pulses 1301-1309. Example verify pulses include an INT-state verify pulse 1310 (VvINT). The pulse train 1300 is an example of a first set of step-wise increasing program voltages. Vpgm_init1 is an example of an initial value of a first set of step-wise increasing program voltages.

A pulse train typically includes program pulses which increase stepwise in amplitude in one or more program-verify iterations of a programming pass using a fixed or varying step size. In some cases, the program pulses increase in each program-verify iteration after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

Figure 13B:
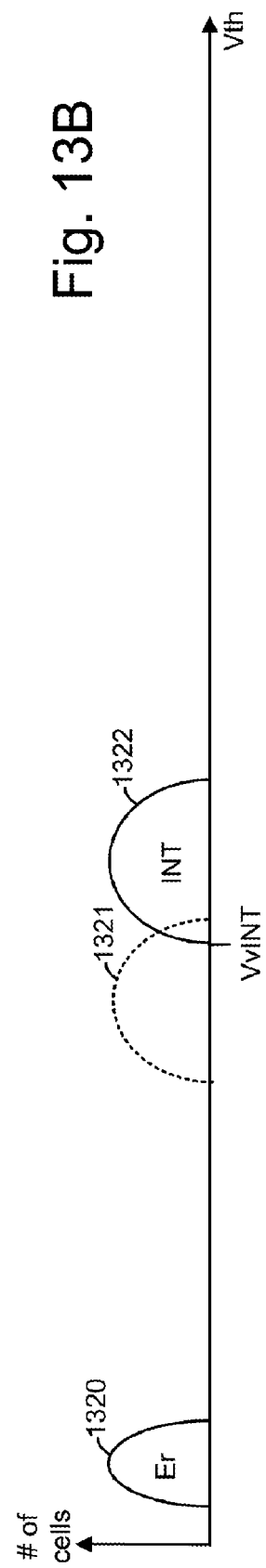
FIG. 13B depicts a Vth of memory cell being programmed to the INT state, consistent with FIG. 13A.

FIG. 13B depicts a Vth of memory cell being programmed to the INT state, consistent with FIG. 13A. The programmed cells will have a Vth which gradually increases from the Er state (distribution 1320) to the INT state (distribution 1322) in a programming pass. Before the programming pass is completed, the Vth distribution will reach a programming milestone, such as when the Vth of at least a specified portion (e.g., 10%) of the cells reaches a verify level VvINT (distribution 1321). As an example, this may be in the fifth PV iteration of FIG. 13A, after the program pulse 1305 is applied. In this case, the magnitude of the program pulse 1305 can be a programming speed-indicating Vpgm (Vrep) such as discussed in connection with step 1201 in FIG. 12A. Or, the magnitude of the final Vpgm as represented by the program pulse 1309 can be the programming speed-indicating Vpgm. The distribution 1322 is reached after the final program pulse is applied. Other variations are possible as well.

FIG. 14 depicts a series of program-verify iterations in an example of a foggy programming pass, consistent with FIG. 9C. The horizontal axis depicts a program-verify iteration number (PV) and the vertical axis depicts a control gate or word line voltage. The pulse train 1400 includes a series of program pulses 1401-1413 that are applied to a word line selected for programming. The pulse train 1400 is an example of a second set of step-wise increasing program voltages. Vpgm_init2 is an example of an initial value of a second set of step-wise increasing program voltages.

One, two or three verify pulses are provided after each program pulse as an example, based on the target data states which are being verified. For example, one or more of an example A-state foggy verify pulse 1420 (VvA_foggy), B-state foggy verify pulse 1421 (VvB_foggy) and C-state foggy verify pulse 1422 (VvC_foggy) may be applied in different program-verify iterations. In this approach, the verify pulses are set based on the programming progress in which A-state cells complete programming before B-state cells, and B-state cells complete programming before C-state cells. Programming time is minimized by this approach.

Further, a verify test is performed using each verify pulse to determine whether a cell has a Vth above or below the verify level. In a verify test, a sensing operation is performed for cells along a word line. A current in each NAND string is compared to a reference current at a sense time. If the current exceeds a reference current, the cell in the NAND string is considered to be in a conductive state and the Vth is below the verify level (the verify test is failed). If the current is less than the reference current, the cell in the NAND string is considered to be in a non-conductive state and the Vth is above the verify level (the verify test is passed). When a cell is sensed and subject to a verify test, data latches can be updated based on a result of the verify test.

FIG. 15 depicts a series of program-verify iterations in an example of a fine programming pass, consistent with FIG. 9D. The horizontal axis depicts a program-verify iteration number (PV) and the vertical axis depicts control gate or word line voltage. The pulse train 1500 includes a series of program pulses 1501-1515 that are applied to a word line selected for programming. The pulse train 1500 is an example of a second or third set of step-wise increasing program voltages. Vpgm_init3 is an example of an initial value of a third set of step-wise increasing program voltages. One, two or three verify pulses are provided after each program pulse as an example, based on the target data states which are being verified. For example, one or more of an example A-state verify pulse 1520 (VvA), B-state verify pulse 1521 (VvB) and C-state verify pulse 1522 (VvC) may be applied in different program-verify iterations.

FIG. 16A depicts example voltages in a programming operation for a fresh set of memory cells. This provides an example of the process of FIG. 12B. Three programming passes are used, such as an INT pass followed by the foggy pass and the fine pass, consistent with FIG. 9A-9D. In the first pass, Vpgm initial is a preset value of 10 V and VpassH is a preset value of 9 V. This is also the reference Vpass, as an example. After the programming pass has been completed, it is determined that Vpgm final is 16 V, which is the programming speed-indicating Vpgm of step 1213, in this example. Vref is a preset value of 16 V for the first pass (and the second and third passes as well, in this example). Or, Vref could be different in each pass. A "difference" (D) is determined as Vpgm final−Vref=16−16=0 V, consistent with step 1214. An offset voltage (Voffset) is not used in the first pass. The notation "x" denotes an entry that is not applicable or does not matter in this example. There is less of a need to optimize VpassH during the first programming pass since the first programming pass is a rough programming.

In the second pass, the initial Vpgm for the second programming pass is determined from (16−5.7)=10.3 V (Vpgm final−Voffset_$2^{nd}$ pass), consistent with step 1216 of FIG. 12B. From testing of the memory device, it is determined that it is optimum for the Vpgm initial in the second programming pass to be 5.7 V lower than the Vpgm final in the first programming pass, before correcting for the level of Vpass. Vpass is not adjusted in this pass since the difference (D) is zero.

In the third pass, the first initial Vpgm is determined from (16−6.2)=9.8 V (Vref−Voffset_3rd pass). From testing of the memory device, it is determined that it is optimum for the Vpgm initial in the third programming pass to be 6.2 V lower than the Vpgm final in the first programming pass. Vpass is not adjusted in this pass since the difference (D) is zero.

The initial Vpgm can vary in the different programming passes. Note that, for a fresh set of memory cells in a fresh memory die, the programming speed can still vary for different sets of memory cells, such as on different word lines. Thus, it is possible to provide an adjustment to Vpass in the second or third passes for a fresh memory die, although this is not depicted in the example of FIG. 16A.

FIG. 16B depicts example voltages in a programming operation for a moderately cycled set of memory cells. As before, in the first pass, Vpgm initial is a preset value of 10 V and VpassH is a preset value of 9 V. After the programming pass has been completed, it is determined that Vpgm final is 15.5 V, which is the programming speed-indicating Vpgm of step 1213, in this example. Vref is a preset value of 16 V. A difference (D) is determined as Vpgm final−Vref=15.5−16=−0.5 V, consistent with step 1214.

In the second pass, a first initial Vpgm is determined from (15.5−5.7−0.5)=9.3 V, where Voffset_2nd pass=5.7 V, consistent with step 1216. The adjustment to Vpass reference is D×20% or 0.5×20%=0.1 V, as an example. In this case, 20% is a multiplier which has been determined to optimally modify Vpass in proportion to Vpgm final. If another programming speed-indicating voltage besides Vpgm final was used, the multiplier could be different, e.g., lower. In this example, the adjustment to Vpass reference is linear with Vpgm final and D. Alternatively, the adjustment to Vpass reference could be non-linear with Vpgm final and D, and looked up using a table, or calculated using an equation, for instance.

Further, an adjustment to the first initial Vpgm is based on the adjustment to Vpass reference. In this example, the adjustment to the first initial Vpgm is a linear function of the adjustment to Vpass reference. The adjustment is obtained using a multiplier of 25/75, which represents a ratio of: (a) a coupling ratio of at least one unselected word line to floating gates of the memory cells of the set of memory cells (e.g., 25%), to (b) a coupling ratio of the selected word line to the floating gates of the memory cells of the set of memory cells (e.g., 75%). Here, the adjustment to the first initial Vpgm is 0.1×25/75=0.1×0.3=0.03 V and is smaller than the adjustment to the reference Vpass (0.1 V). In other words, a floating gate of a selected cell is expected to experience the same programming effect from a 0.03 V change in the selected word line as a 0.1 V change in the two adjacent unselected word lines, in this example. The second (final) initial Vpgm for the second programming pass is therefore 9.3+0.03=9.33 V. The adjustment is fairly small but significant due to the need to carefully control the voltages of the memory device, as discussed.

Further, the adjustment to Vpass is negative because the difference (D) indicates that the programming speed is higher than for the fresh device. As a result, a lower initial Vpgm will be used in the next pass, so Vpass can also be lower. Generally, the adjustment to the reference Vpass could be positive or negative. The adjustment to the first initial Vpgm is positive in this example, opposite to the polarity of the adjustment to the reference Vpass.

Optionally, different Vpass levels can be determined for different unselected word lines according to their coupling ratios with respect to the selected word line.

In the third pass, the first initial Vpgm is determined from (15.5−6.2−0.5)=8.8 V, where Voffset_$3^{rd}$ pass=6.2 V, consistent with step 1221. Vpass is set the same as in the second pass in this example. The second initial Vpgm is obtained from 8.8+0.1×25/75=8.8+0.03=8.83 V. The adjustment to the first initial Vpgm is the same as in the second programming pass.

Generally, the reference Vpass is adjusted to obtain an adjusted Vpass for the second and third programming passes, where the reference Vpass may or may not be the same as the Vpass in the first programming pass In another option, the Vpass is different for different program verify iterations in a programming pass. For example, Vpass may be higher when Vpgm is higher.

FIG. 16C depicts example voltages in a programming operation for a heavily cycled set of memory cells. In the first pass, Vpgm initial is a preset value of 10 V and VpassH is a preset value of 9 V. After the programming pass has been completed, it is determined that Vpgm final is 15.0 V, which is the programming speed-indicating Vpgm of step 1213, in this example. Vref is a preset value of 16 V. A difference (D) is determined as Vpgm final−Vref=15.0−16=−1.0 V, consistent with step 1214.

In the second pass, the first initial Vpgm is determined from (15.5−5.7−1.0)=8.3 V, where Voffset_$2^{nd}$ pass=5.7 V, consistent with step 1216. The adjustment to the reference Vpass is D×20%=−1×20%=−0.2 V, so the adjusted Vpass is 9−0.2=8.8 V. The adjustment to the first initial Vpgm is 0.2×25/75=0.06 V and the second initial Vpgm is 8.3+0.06=8.36 V, consistent with step 1217.

In the third pass, the first initial Vpgm is determined from (15.5−6.2−1.0)=7.8 V, where Voffset_3rd pass=6.2 V, consistent with step 1221. The adjusted Vpass is 8.8 V. The adjustment to the first initial Vpgm is 0.2×25/75=0.06 V and the second initial Vpgm is 7.8+0.06=7.86 V, consistent with step 1222.

The adjustment to Vpass is larger in magnitude than for the moderately cycled device because the difference D indicates that the programming speed is higher than for the moderately cycled device.

FIG. 17 depicts an effect of Vpass on programming of a selected memory cell MCn. MCn−1 is an adjacent cell on WLn−1 and MCn+1 is an adjacent cell on WLn+1. VpassH (a higher Vpass) is applied to MCn−1 and MCn+1. FGn−1, FGn and FGn+1 are the floating gates of MCn−1, MCn and MCn+1, respectively. The floating gate is subject to an effective or total program voltage which is based on Vpgm and VpassH. In particular, a relatively high coupling ratio such as 75% (CRs) describes the capacitive coupling from WLn to FGn. The program voltage seen by FGn due to Vpgm is therefore Vpgm×0.75. A relatively low coupling ratio such as 12.5% (CRn−1, CRn+1) describes the capacitive coupling from each of WLn−1 and WLn+1 to FGn. The program voltage seen by FGn due to VpassH on WLn−1 is therefore VpassH×0.125. Similarly, the program voltage seen by FGn due to VpassH on WLn+1 is VpassH×0.125. The total program voltage seen by FGn due to VpassH on WLn−1 and WLn+1 is therefore VpassH×0.25, representing a 25% coupling ratio. Coupling from non-adjacent word lines could also be considered but the effect is smaller than for the adjacent word lines. The coupling will be greatest for the adjacent word lines since they are closest to the selected word line. The coupling will be second greatest for the second adjacent word lines since they are second closest to the selected word line, and so forth. Typically, the coupling will be the same for both adjacent word lines.

A sum of coupling ratios can be used for each unselected word line for which the pass voltage is to be adjusted. For example, if the Vpass is to be adjusted for only the two adjacent unselected word lines, and the coupling ratio of each adjacent unselected word line is 12.5%, a total coupling ratio of the unselected word lines to the selected memory cells is 25%. A ratio of coupling ratios is 25/75 or 1/3 as discussed in the examples of FIGS. 16B and 16C. This ratio can be used to set an adjustment to Vpgm initial based on an adjustment to Vpass.

The coupling due to the unselected word lines is a significant influence on the effective Vpgm. Accordingly, when Vpass is adjusted, such as to optimize Vpass, the effective Vpgm changes. Vpgm should be adjusted to counteract the change in the effective Vpgm. For instance, when Vpass is decreased, the effective Vpgm seen by FGn will be lower if Vpgm is not increased. By increasing Vpgm, the decrease in the effective Vpgm can be counteracted. As a result, the programming can occur with the desired effective Vpgm while allowing for changes in Vpass which optimally reduce fail bits.

Theoretically, the optimum Vpgm for a set of memory cells should have a strong correlation to the optimum VpassH. This is because the neutral Vth and cell coupling ratio is a strong indicator of how easily a cell can be programmed (Vch=0V, WLn=VPGM) and program disturbed (Vch=0V, WLn−1/n+1=VpassH). In other words, for those cells which are easier to program by Vpgm, they are similarly easier to program by VpassH. The optimum Vpgm correlates well with the optimum VpassH.

FIG. 18A is a plot showing a correspondence between initial Vpgm and Vpass optimum, consistent with FIG. 6A-6C. As mentioned, a lower Vpass optimum is correlated with increased cycling or an increase in the magnitude of the difference (D) between a programming speed-indicating Vpgm and a reference Vpgm. For a given temperature, Vpass optimum and the initial Vpgm decrease with cycling. The slope of the decrease is consistent for the different temperatures. For a given Vpass optimum, initial Vpgm decreases as temperature increases.

FIG. 18B is a plot of the room temperature case of FIG. 18A, showing how Vpass and Vpgm are adjusted for a detected level of a difference between a programming speed-indicating Vpgm and a reference Vpgm. The data points represent the minimum fail bit counts for the data points PE1/D1, PE2/D2, PE3/D3 and PE4/D4 of FIG. 6B. The values of PE1, PE2, PE3 and PE4 may be 0, 100, 300 and 500 cycles, respectively, for example. The values of D1, D2 and D3 may be 0 V, −0.5 V, −1 V, respectively, for example, consistent with FIGS. 16A, 16B and 16C, respectively. The value of D4 may be −1.5 V as a further data point. For the moderately cycled device discussed in connection with FIG. 16B, the adjusted Vpass is 8.9 V, which is a 0.1 V decrease from the reference Vpass of 9 V. Further, the adjustment in the initial Vpgm is 0.03 V, from 9.3 V to 9.33 V.

FIG. 18C is a plot showing various voltages using in a multi-pass programming operation, as a function of PE cycles or of the difference D of FIG. 18B. The horizontal axis depicts cycles or the difference between a programming speed-indicating Vpgm and a reference Vpgm. The vertical axis depicts voltage. In this example, the reference Vpgm is a fixed value. The programming speed-indicating Vpgm is equal to the reference Vpgm at PE or D=0, and decreases as PE or D increases. As a result, the first initial Vpgm also decreases as PE or D increase, assuming a fixed offset from the programming speed-indicating Vpgm is used to obtain the first initial Vpgm. The adjustment to Vpass increases in magnitude as PE or D increases. As a result, the adjustment to the initial Vpgm also increases as PE or D increases. The second initial Vpgm decreases as PE or D increases but to a lesser extent than the decrease in the first initial Vpgm.

Generally, with increasing cycles, a set of memory cells becomes easier to program, so that a lower program voltage is sufficient to complete a programming pass or reach a programming milestone before the end of a programming pass. However, the technique provided herein optimizes the programming based on any change in performance as reflected by D, whether the change is caused by cycling or some other factor. For example, a temporary change in performance can occur which is not related to PE cycles.

Accordingly, it can be seen that, in one embodiment, a method is provided for programming a set of memory cells (205) connected to a selected word line (WL2) in a memory device (190). The method comprises: performing one programming pass of a multi-pass programming operation for the set of memory cells, wherein a first set of step-wise increasing program voltages (1300) is applied to the selected word line during the one programming pass; determining a programming speed-indicating program voltage (Vrep) of the first set of step-wise increasing program voltages which indicates a programming speed of the set of memory cells during the one programming pass; determining an adjusted pass voltage (VpassH) to be used for another programming pass of the multi-pass programming operation based on an adjustment to a reference pass voltage, the adjustment to the reference pass voltage is based on the programming speed-indicating program voltage; determining a first initial value of a second set of step-wise increasing program voltages (1400, 1500) for the another programming pass based on the programming speed-indicating program voltage; determining an adjustment to the first initial value based on the adjustment to the reference pass voltage, to provide a second initial value (Vpgm_init2, Vpgm_init3), the adjustment to the first initial value is of opposite polarity to the adjustment to the reference pass voltage; and performing the another programming pass for the set of memory cells, wherein the second set of step-wise increasing program voltages is applied to the selected word line during the another programming pass, the second set of step-wise increasing program voltages has the second initial value, and the adjusted pass voltage is applied to at least one unselected word line during one or more program voltages (1401-1413; 1501-1515) of the second set of step-wise increasing program voltages.

In another embodiment, a memory device (190) comprises: a set of memory cells (205) connected to a selected word line (WL2), and a control circuit (100, 110, 112, 114, 116, 117, 150, 160, 165, 192, MC0). The control circuit: performs one programming pass of a multi-pass programming operation for the set of memory cells, wherein a first set of step-wise increasing program voltages (1300) is applied to the selected word line during the one programming pass; determines a program voltage (Vrep) of the first set of step-wise increasing program voltages which indicates a programming speed of the set of memory cells during the one programming pass; determines a difference between the program voltage and a reference program voltage; determines an adjustment to a reference pass voltage based on the difference; determines an adjusted pass voltage (VpassH) to be used for another programming pass of the multi-pass programming operation based on the reference pass voltage modified by the adjustment to the reference pass voltage; determines a first initial value of a second set of step-wise increasing program voltages (1400, 1500) for the another programming pass based on the program voltage; and provides an adjustment to the first initial value based on the adjustment to the reference pass voltage, to provide a second initial value (Vpgm_init2, Vpgm_init3) of the second set of step-wise increasing program voltages for the another programming pass.

In another embodiment, a method is provided for programming a set of memory cells (205) connected to a selected word line (WL2) in a memory device (100). The method comprises: performing one programming pass of a multi-pass programming operation for the set of memory cells, wherein a first set of step-wise increasing program voltages (1300) is applied to the selected word line during the one programming pass; determining a performance metric (Vrep) of the memory device based on the one programming pass; and performing another programming pass of the multi-pass programming operation for the set of memory cells, wherein a second set of step-wise increasing program voltages (1400, 1500) is applied to the selected word line during the another programming pass, an adjusted pass voltage (VpassH) is applied to the at least one unselected word line when the second set of step-wise increasing program voltages is applied to the selected word line, the adjusted pass voltage is set by providing an adjustment to a reference pass voltage according to the performance metric, and an initial value (Vpgm_init2, Vpgm_init3) of the second set of step-wise increasing program voltages is based on the adjustment to the reference pass voltage and the performance metric.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of memory cells connected to a selected word line in a memory device, comprising:

configuring the memory device with a reference initial program voltage;

configuring the memory device with a reference final program voltage;

configuring the memory device with a first reference offset voltage;

configuring the memory device with a reference pass voltage;

performing one programming pass of a multi-pass programming operation for the set of memory cells by applying a first set of step-wise increasing program voltages having the reference initial program voltage to the selected word line and applying the reference pass voltage to at least one unselected word line during one or more program voltages of the first set of step-wise increasing program voltages;

determining a final program voltage of the first set of step-wise increasing program voltages upon completion of the one programming pass;

determining an adjusted pass voltage from an adjustment to the reference pass voltage, the adjustment to the reference pass voltage is based on a difference between the determined final program voltage and the reference final program voltage;

determining a first initial program voltage of a second set of step-wise increasing program voltages based on the determined final program voltage minus the first reference offset voltage minus another offset;

determining an adjustment to the first initial program voltage based on the adjustment to the reference pass voltage, to provide a second initial program voltage, the adjustment to the first initial program voltage is of opposite polarity to the adjustment to the reference pass voltage; and performing another programming pass for the set of memory cells by applying the second set of step-wise increasing program voltages having the second initial program voltage to the selected word line and applying the adjusted pass voltage to the at least one unselected word line during one or more program voltages of the second set of step-wise increasing program voltages.

2. The method of claim 1, wherein:
the adjustment to the first initial program voltage is proportional to the adjustment to the reference pass voltage multiplied by a ratio of: (a) a coupling ratio of the at least one unselected word line to floating gates of the memory cells of the set of memory cells, to (b) a coupling ratio of the selected word line to the floating gates of the memory cells of the set of memory cells.

3. The method of claim 2, wherein:
the adjustment to the first initial program voltage value has a smaller magnitude than the adjustment to the reference pass voltage.

4. The method of claim 1, wherein:
the adjustment to the reference pass voltage is based on the difference between the determined final program voltage and the reference program voltage, multiplied by a multiplier less than one.

5. The method of claim 4, wherein:
the reference program voltage is a program voltage for the memory device when the memory device is fresh.

6. The method of claim 1, wherein:
the at least one unselected word line is adjacent to the selected word.

7. The method of claim 1, further comprising:
determining the adjusted pass voltage based on temperature, the adjusted pass voltage is relatively higher when the temperature is relatively higher.

8. The method of claim 1, further comprising:
limiting the adjustment to the reference pass voltage and the adjustment to the first initial program voltage.

9. The method of claim 1, wherein:
the one programming pass is a first programming pass of the multi-pass programming operation and the another programming pass is a second programming pass of the multi-pass programming operation.

10. The method of claim 1, wherein:
the one programming pass is a first programming pass of the multi-pass programming operation and the another programming pass is a third programming pass of the multi-pass programming operation.

11. A memory device, comprising:
a set of memory cells connected to a selected word line;
a storage location which is configured with a reference initial program voltage, a reference final program voltage, a first reference offset voltage, and a reference pass voltage; and
a control circuit, the control circuit is configured to:
perform one programming pass of a multi-pass programming operation for the set of memory cells, wherein a first set of step-wise increasing program voltages having the reference initial program voltage is applied to the selected word line during the one programming pass and the reference pass voltage is applied to at least one unselected word line during one or more program voltages of the first set of step-wise increasing program voltages;
determine a final program voltage of the first set of step-wise increasing program voltages upon completion of the one programming pass;
determine an adjusted pass voltage from an adjustment to the reference pass voltage, the adjustment to the reference pass voltage is based on a difference between the determined final program voltage and the reference final program voltage;
determining a first initial program voltage of a second set of step-wise increasing program voltages based on the determined final program voltage minus the first reference offset voltage minus another offset;
determine an adjustment to the first initial program voltage based on the adjustment to the reference pass voltage, to provide a second initial program voltage, the adjustment to the first initial program voltage is of opposite polarity to the adjustment to the reference pass voltage; and
perform another programming pass for the set of memory cells, wherein the second set of step-wise increasing program voltages having the second initial program voltage is applied to the selected word line during the another programming pass and the dis applied to the at least one unselected word line during one or more program voltages of the second set of step-wise increasing program voltages.

12. The memory device of claim 11, wherein:
the control circuit is configured to determine the adjusted pass voltage based on temperature, the adjusted pass voltage is relatively higher when the temperature is relatively higher.

13. The memory device of claim 11, wherein:
the adjustment to the reference pass voltage is of opposite polarity to the adjustment to the first initial program voltage.

14. A method for programming a set of memory cells connected to a selected word line in a memory device, comprising:
performing one programming pass of a multi-pass programming operation for the set of memory cells, wherein a first set of step-wise increasing program voltages is applied to the selected word line during the one programming pass;
determining a performance metric of the memory device based on the one programming pass, the performance metric is a program voltage of the first set of step-wise increasing program voltages when a programming milestone is reached during the one programming pass; and
performing another programming pass of the multi-pass programming operation for the set of memory cells, wherein a second set of step-wise increasing program voltages is applied to the selected word line during the another programming pass, an adjusted pass voltage is applied to the at least one unselected word line when the second set of step-wise increasing program voltages is applied to the selected word line, the adjusted pass voltage is set by providing an adjustment to a reference pass voltage according to the performance metric, and an initial value of the second set of step-wise increasing program voltages is based on the adjustment to the reference pass voltage and the performance metric.

15. The method of claim 14, wherein:
the program voltage which is the performance metric is a final program voltage of the first set of step-wise increasing program voltages during the one programming pass.

16. The method of claim 14, wherein:
the initial value is of opposite polarity to the adjustment to the reference pass voltage.

17. The method of claim 14, wherein:
the initial value is proportional to the adjustment to the reference pass voltage multiplied by ratio of: (a) a coupling ratio of the at least one unselected word line to floating gates of the memory cells of the set of memory cells, to (b) a coupling ratio of the selected word line to the floating gates of the memory cells of the set of memory cells.

18. The method of claim 1, wherein:
the reference initial program voltage, the reference final program voltage, the first reference offset voltage and the reference pass voltage are used in programming the set of memory cells when the memory device is fresh, moderately cycled and heavily cycled.

19. The memory device of claim 11, wherein:
the reference initial program voltage, the reference final program voltage, the first reference offset voltage and the reference pass voltage are used in programming the set of memory cells when the memory device is fresh, moderately cycled and heavily cycled.

20. The method of claim 14, wherein:
the programming milestone is reached before the one programming pass has completed.

* * * * *